(12) United States Patent
Ishii

(10) Patent No.: US 8,624,650 B2
(45) Date of Patent: Jan. 7, 2014

(54) SEMICONDUCTOR DEVICE

(75) Inventor: Masato Ishii, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 148 days.

(21) Appl. No.: 12/972,623

(22) Filed: Dec. 20, 2010

(65) Prior Publication Data

US 2011/0148497 A1 Jun. 23, 2011

(30) Foreign Application Priority Data

Dec. 23, 2009 (JP) ................................. 2009-291587

(51) Int. Cl.
*H03K 3/289* (2006.01)

(52) U.S. Cl.
USPC ............ 327/202; 327/208; 327/217; 327/218

(58) Field of Classification Search
USPC ................. 327/199–203, 208, 210–212, 215, 327/217–219
See application file for complete search history.

(56) References Cited

U.S. PATENT DOCUMENTS

| | | | |
|---|---|---|---|
| 3,599,018 A * | 8/1971 | Washizuka et al. | 327/213 |
| 3,624,423 A | 11/1971 | Borgini | |
| 3,812,384 A * | 5/1974 | Skorup | 327/203 |
| 4,554,467 A | 11/1985 | Vaughn | |
| 5,498,988 A | 3/1996 | Reyes et al. | |
| 5,654,658 A | 8/1997 | Kubota et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,310,501 B1 | 10/2001 | Yamashita | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Long Nguyen

(74) *Attorney, Agent, or Firm* — Eric J. Robinson; Robinson Intellectual Property Law Office, P.C.

(57) ABSTRACT

An object is to provide a low-power semiconductor device which does not require a latch circuit to hold data at the output of inverter circuits. In the semiconductor device, an input of a first inverter circuit is connected to an input terminal through a source and a drain of a first transistor. An input of a second inverter circuit is connected to an output of the first inverter circuit through a source and a drain of a second transistor. An output of the second inverter is connected to an output terminal. An inverted clock signal and a clock signal are input to gates of the first transistor and the second transistor, respectively. The first and the second transistor have extremely low off-current, which allows the output potential of the device to remain unchanged even when the input varies.

38 Claims, 12 Drawing Sheets

(56) References Cited

U.S. PATENT DOCUMENTS

| | | | |
|---|---|---|---|
| 6,501,315 B1 | 12/2002 | Nguyen | |
| 6,563,174 B2 | 5/2003 | Kawasaki et al. | |
| 6,566,927 B2 | 5/2003 | Park et al. | |
| 6,727,522 B1 | 4/2004 | Kawasaki et al. | |
| 6,762,637 B2 * | 7/2004 | Raychaudhuri | 327/202 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,183,825 B2 | 2/2007 | Padhye et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0141913 A1 | 7/2003 | Park et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0102018 A1 | 5/2011 | Shionoiri et al. | |

FOREIGN PATENT DOCUMENTS

| | | | | |
|---|---|---|---|---|
| JP | 60-198861 A | | 10/1985 | |
| JP | 63-210022 A | | 8/1988 | |
| JP | 63-210023 A | | 8/1988 | |
| JP | 63-210024 A | | 8/1988 | |
| JP | 63-215519 A | | 9/1988 | |
| JP | 63-239117 A | | 10/1988 | |
| JP | 63-265818 A | | 11/1988 | |
| JP | 02190018 A * | | 7/1990 | 327/212 |
| JP | 03-187513 | | 8/1991 | |
| JP | 03-187513 A | | 8/1991 | |
| JP | 3187513 A * | | 8/1991 | |
| JP | 03-228296 A | | 10/1991 | |
| JP | 05-251705 A | | 9/1993 | |
| JP | 08-264794 A | | 10/1996 | |
| JP | 09-223948 A | | 8/1997 | |
| JP | 11-505377 | | 5/1999 | |
| JP | 2000-044236 A | | 2/2000 | |
| JP | 2000-150900 A | | 5/2000 | |
| JP | 2002-076356 A | | 3/2002 | |
| JP | 2002-289859 A | | 10/2002 | |
| JP | 2003-086000 A | | 3/2003 | |
| JP | 2003-086808 A | | 3/2003 | |
| JP | 2004-103957 A | | 4/2004 | |
| JP | 2004-273614 A | | 9/2004 | |
| JP | 2004-273732 A | | 9/2004 | |
| WO | WO 2004/114391 | | 12/2004 | |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15TH International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

(56) References Cited

OTHER PUBLICATIONS

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-gel-Derived Zinc Oxide Films by Irradiation With Ultraviolet Lamp,", Journal of Sol-gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H at al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display

(56) References Cited

OTHER PUBLICATIONS

Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N. et al., "SPINEL,YbFe2O4, and Yb2FeE3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al.,"Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2010/071417) Dated Dec. 28, 2010.

Written Opinion (Application No. PCT/JP2010/071417) Dated Dec. 28, 2010.

\* cited by examiner

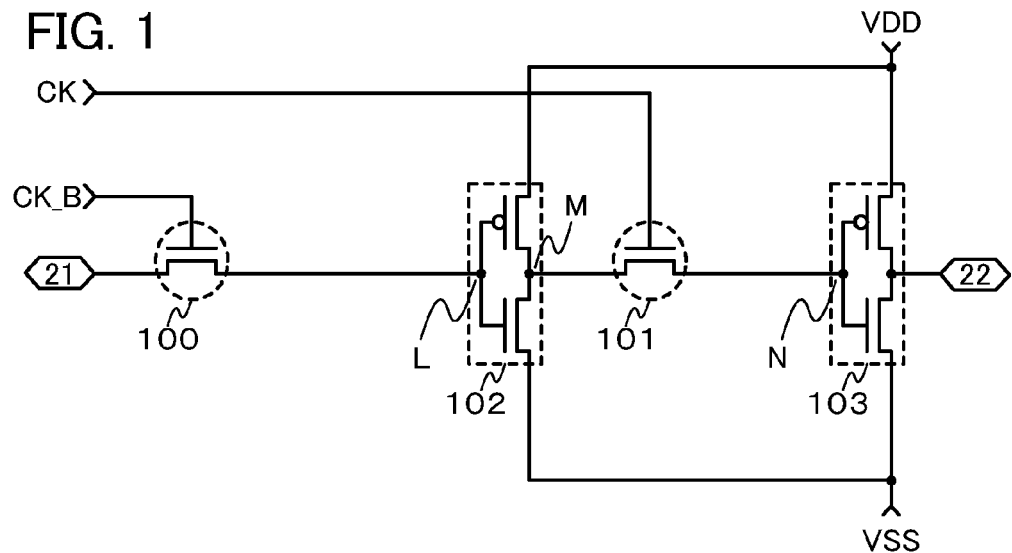
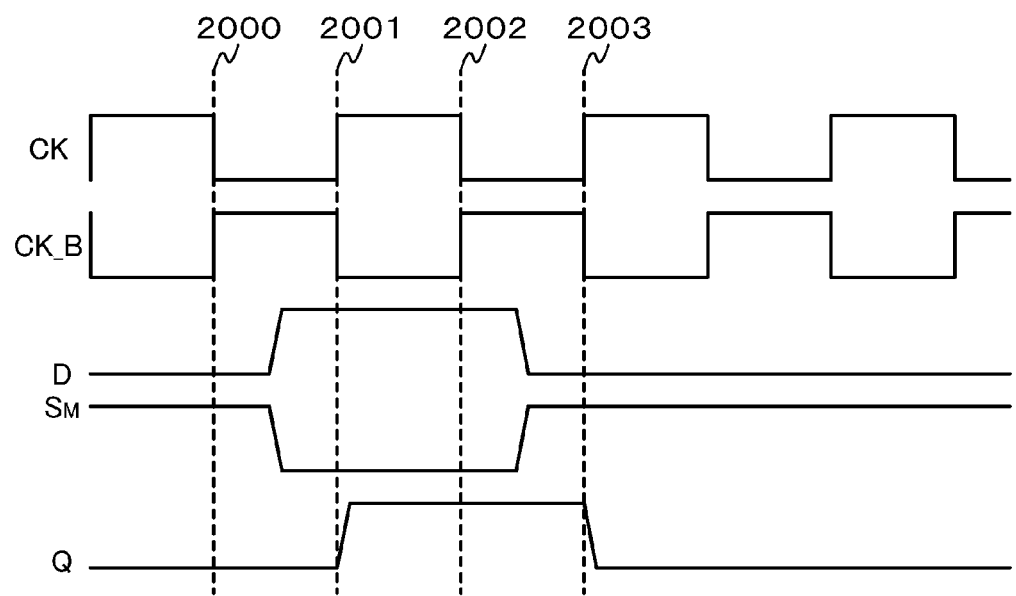

SEMICONDUCTOR DEVICE

TECHNICAL FIELD

The present invention relates to a semiconductor device, and particularly to a flip-flop which is a kind of logic circuit.

BACKGROUND ART

Since recent years, electronic appliances are required to consume lower power to reduce the load on the environment. A way of achieving lower power consumption is to reduce the power consumption of integrated circuits (e.g., LSI devices: large scale integration devices) mounted on electronic appliances.

An integrated circuit includes a flip-flop which is a kind of logic circuit. Examples of flip-flops include not only a simple flip-flop which obtains data in accordance with the pulse of a clock signal, but also a flip-flop having a reset terminal, a flip-flop having a set terminal, and a flip-flop having a reset terminal and a set terminal. These flip-flops each have a latch circuit having a function of holding data (see for example Patent Document 1). Further, a flip-flop having a reset terminal, a flip-flop having a set terminal, and a flip-flop having a reset terminal and a set terminal each additionally have a NAND circuit, and the like.

[Reference]

[Patent Document 1] U.S. Pat. No. 4,554,467

DISCLOSURE OF INVENTION

As described above, a flip-flop has a latch circuit having a function of holding data, a NAND circuit, and the like. A great number of transistors are used to constitute a latch circuit or a NAND circuit, which makes it difficult to reduce power consumption.

One embodiment of the present invention is made in view of the above problem and one of its objects is to provide a flip-flop having reduced power consumption.

One embodiment of the present invention is a semiconductor device including a first transistor, a second transistor, a first inverter circuit, and a second inverter circuit. An inverted clock signal is input to a gate of the first transistor. A clock signal is input to a gate of the second transistor. One of a source and a drain of the first transistor is electrically connected to a first wiring. The other of the source and the drain of the first transistor is electrically connected to an input of the first inverter circuit. An output of the first inverter circuit is electrically connected to one of a source and a drain of the second transistor. The other of the source and the drain of the second transistor is electrically connected to an input of the second inverter circuit. An output of the second inverter circuit is electrically connected to a second wiring.

One embodiment of the present invention is a semiconductor device including a first transistor, a second transistor, a third transistor, a fourth transistor, a first inverter circuit, and a second inverter circuit. An inverted clock signal is input to a gate of the first transistor. A clock signal is input to a gate of the second transistor. A reset signal is input to a gate of the third transistor and a gate of the fourth transistor. One of a source and a drain of the first transistor is electrically connected to a first wiring. The other of the source and the drain of the first transistor is electrically connected to an input of the first inverter circuit. An output of the first inverter circuit is electrically connected to one of a source and a drain of the second transistor. The other of the source and the drain of the second transistor is electrically connected to an input of the second inverter circuit. An output of the second inverter circuit is electrically connected to a second wiring. One of a source and a drain of the third transistor is electrically connected to the input of the first inverter circuit. The other of the source and the drain of the third transistor is electrically connected to a low voltage supply line. One of a source and a drain of the fourth transistor is electrically connected to the input of the second inverter circuit. The other of the source and the drain of the fourth transistor is electrically connected to a high voltage supply line.

One embodiment of the present invention is a semiconductor device including a first transistor, a second transistor, a fifth transistor, a sixth transistor, a first inverter circuit, and a second inverter circuit. An inverted clock signal is input to a gate of the first transistor. A clock signal is input to a gate of the second transistor. A set signal is input to a gate of the fifth transistor and a gate of the sixth transistor. One of a source and a drain of the first transistor is electrically connected to a first wiring. The other of the source and the drain of the first transistor is electrically connected to an input of the first inverter circuit. An output of the first inverter circuit is electrically connected to one of a source and a drain of the second transistor. The other of the source and the drain of the second transistor is electrically connected to an input of the second inverter circuit. An output of the second inverter circuit is electrically connected to a second wiring. One of a source and a drain of the fifth transistor is electrically connected to the input of the first inverter circuit. The other of the source and the drain of the fifth transistor is electrically connected to a high voltage supply line. One of a source and a drain of the sixth transistor is electrically connected to the input of the second inverter circuit. The other of the source and the drain of the sixth transistor is electrically connected to a low voltage supply line.

One embodiment of the present invention is a semiconductor device including a first transistor, a second transistor, a third transistor, a fourth transistor, a fifth transistor, a sixth transistor, a first inverter circuit, and a second inverter circuit. An inverted clock signal is input to a gate of the first transistor. A clock signal is input to a gate of the second transistor. A reset signal is input to a gate of the third transistor and a gate of the fourth transistor. A set signal is input to a gate of the fifth transistor and a gate of the sixth transistor. One of a source and a drain of the first transistor is electrically connected to a first wiring. The other of the source and the drain of the first transistor is electrically connected to an input of the first inverter circuit. An output of the first inverter circuit is electrically connected to one of a source and a drain of the second transistor. The other of the source and the drain of the second transistor is electrically connected to an input of the second inverter circuit. An output of the second inverter circuit is electrically connected to a second wiring. One of a source and a drain of the third transistor is electrically connected to the input of the first inverter circuit. The other of the source and the drain of the third transistor is electrically connected to a low voltage supply line. One of a source and a drain of the fourth transistor is electrically connected to the input of the second inverter circuit. The other of the source and the drain of the fourth transistor is electrically connected to a high voltage supply line. One of a source and a drain of the fifth transistor is electrically connected to the input of the first inverter circuit. The other of the source and the drain of the fifth transistor is electrically connected to the high voltage supply line. One of a source and a drain of the sixth transistor is electrically connected to the input of the second inverter circuit. The other of the source and the drain of the sixth transistor is electrically connected to the low voltage supply line.

One embodiment of the present invention is a semiconductor device including a first transistor, a second transistor, a first inverter circuit, a second inverter circuit, a first capacitor including a pair of electrodes, and a second capacitor including a pair of electrodes. An inverted clock signal is input to a gate of the first transistor. A clock signal is input to a gate of the second transistor. One of a source and a drain of the first transistor is electrically connected to a first wiring. The other of the source and the drain of the first transistor is electrically connected to an input of the first inverter circuit. An output of the first inverter circuit is electrically connected to one of a source and a drain of the second transistor. The other of the source and the drain of the second transistor is electrically connected to an input of the second inverter circuit. An output of the second inverter circuit is electrically connected to a second wiring. One electrode of the first capacitor is electrically connected to the input of the first inverter circuit. The other electrode of the first capacitor is electrically connected to a low voltage supply line. One electrode of the second capacitor is electrically connected to the input of the second inverter circuit. The other electrode of the second capacitor is electrically connected to the low voltage supply line.

One embodiment of the present invention is characterized in that the third transistor and the fourth transistor each include an oxide semiconductor layer in which a carrier concentration is less than $1 \times 10^{14}/cm^3$.

One embodiment of the present invention is characterized in that the fifth transistor and the sixth transistor each include an oxide semiconductor layer in which a carrier concentration is less than $1 \times 10^{14}/cm^3$.

One embodiment of the present invention is characterized in that the first transistor and the second transistor each include an oxide semiconductor layer in which a carrier concentration is less than $1 \times 10^{14}/cm^3$.

One embodiment of the present invention is characterized in that a band gap of the oxide semiconductor layer is 2 eV or more.

One embodiment of the present invention is characterized in that the first inverter circuit and the second inverter circuit each are a CMOS inverter circuit.

One embodiment of the present invention is characterized in that the semiconductor device is a flip-flop. Such a circuit may constitute, for example, a stage of a shift register, and may be part of a driver circuit used in a display device.

One embodiment of the present invention is an electronic appliance including the semiconductor device.

Note that the source and the drain of a transistor are difficult to distinguish from one another because of the structure of the transistor. Further, high potential and low potential might be interchanged depending on the circuit operation. Therefore, in this specification, a source and a drain are not determined and each may be referred to as a first electrode (or a first terminal) or a second electrode (or a second terminal). For example, when a first electrode is a source, a second electrode is a drain, whereas when a first electrode is a drain, a second electrode is a source.

In this specification, the description "A and B are connected to each other" means that A and B are electrically connected to each other (i.e., A and B are connected to each other with another element or circuit placed therebetween), A and B are functionally connected to each other (i.e., A and B are functionally connected to each other with another circuit placed therebetween), A and B are directly connected to each other (i.e., A and B are connected to each other without any other elements or circuits placed therebetween), for example. Note that A and B each are an object (e.g., a device, an element, a circuit, a wire, an electrode, a terminal, a conductive film, or a layer).

Terms such as "first", "second", "third", to "N (N is a natural number)" used in this specification are used only for preventing confusion between components, and thus do not limit numbers. For example, in this specification, the expression "first transistor" can be read as "second transistor" as long as there is no confusion between components.

One embodiment of the present invention enables a flip-flop to be made without using a latch circuit, so that the number of transistors in the flip-flop can be reduced. This results in a reduction in power consumption. Further, reducing the number of transistors leads to a reduction in the area occupied by flip-flops in an integrated circuit.

In addition, in one embodiment of the present invention, a transistor included in a flip-flop is a transistor using an oxide semiconductor whose carrier concentration is less than $1 \times 10^{14}/cm^3$. Thus, by using a transistor whose off-state current is extremely low, a flip-flop can be made without being provided with a latch circuit.

BRIEF DESCRIPTION OF DRAWINGS

FIG. 1 shows an example of a structure of a flip-flop.
FIG. 2 is a timing chart of the flip-flop of FIG. 1.

BEST MODE FOR CARRYING OUT THE INVENTION

Figure 3:
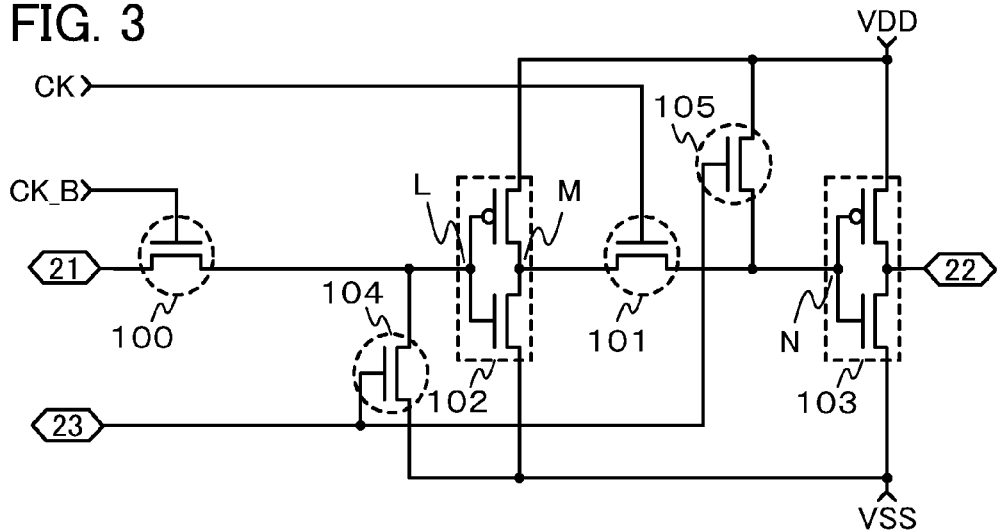
FIG. 3 shows an example of a structure of a flip-flop.

Embodiments of the present invention will be described in detail with reference to the accompanying drawings. Note that the present invention is not limited to the description below, and it is easily understood by those skilled in the art that modes and details can be modified in various ways without departing from the purpose and the scope of the present invention. Therefore, the present invention should not be construed as being limited to the following description of the embodiments. Note that in the embodiments of the present invention described below, the same reference numerals are used to denote the same components in different drawings.

Note that, each of the embodiments described below can be implemented by being combined with any of the other embodiments given in this specification unless otherwise specified.

(Embodiment 1)

In this embodiment, an example of the configuration of a flip-flop which is one embodiment of the present invention will be described.

A flip-flop according to this embodiment includes a first transistor 100, a second transistor 101, a first inverter circuit 102, and a second inverter circuit 103, as show in FIG. 1.

The gate of the first transistor 100 is electrically connected to a wire serving as an inverted clock signal line. Thus, an inverted clock signal CK_B is input to the gate of the first transistor 100 via the wire. The gate of the second transistor 101 is electrically connected to a wire serving as a clock signal line. Thus, a clock signal CK (also referred to as a non-inverted clock signal) is input to the gate of the second transistor 101 via the wire. Note that the clock signal CK and the inverted clock signal CK_B are in synchronization with each other. The inverted clock signal CK_B is an inverted signal of the clock signal CK.

One of the source and the drain of the first transistor 100 is electrically connected to an input terminal 21 via a wire. The input terminal 21 is the input of the flip-flop, and a data signal is input thereto. The other of the source and the drain of the first transistor 100 is electrically connected to the input of the first inverter 102 via a wire. The output of the first inverter circuit 102 is electrically connected to one of the source and the drain of the second transistor 101 via a wire. The other of the source and the drain of the second transistor 101 is electrically connected to the input of the second inverter circuit 103 via a wire. The output of the second inverter 103 is electrically connected to an output terminal 22 via a wire. Note that the output terminal 22 is the output of the flip-flop.

In FIG. 1, VDD is the high voltage supply potential, while VSS is the low voltage supply potential. In this specification, "high voltage supply potential VDD" is a potential higher than the reference potential, while "low voltage supply potential VSS" is a potential lower than the reference potential (e.g. the ground potential). In addition, a wire for supplying the high voltage supply potential VDD to an element such as a transistor is called a high voltage supply line, while a wire for supplying the low voltage supply potential VSS to an element such as a transistor is called a low voltage supply line. Note that, preferably, a difference between the high voltage supply potential and the low voltage supply potential is such that the flip-flop can operate.

Note that voltage refers to a potential difference between a predetermined potential and a reference potential (e.g., a ground potential) in many cases. Therefore, voltage, potential and potential difference can be referred to as potential, voltage, and voltage difference, respectively.

Next, the characteristics of the first transistor 100 and second transistor 101 shown in FIG. 1 will be described.

The first transistor 100 and the second transistor 101 each use a high-purity oxide semiconductor for their channel formation regions. Here, a "high-purity oxide semiconductor" is an oxide semiconductor in which hydrogen is reduced as much as possible and which is intrinsic or substantially intrinsic. An example of the high-purity oxide semiconductor is an oxide semiconductor whose carrier concentration is less than $1\times10^{14}/cm^3$, preferably less than $1\times10^{12}/cm^3$, more preferably less than $1\times10^{11}/cm^3$ or less than $6.0\times10^{10}/cm^3$. A transistor whose channel formation region is formed using an oxide semiconductor is characterized by its off-state current which is extremely low compared to the off-state current of a transistor whose channel formation region is formed using silicon, for example. In the following description of this embodiment, the first transistor 100 and second transistor 101 using a high-purity oxide semiconductor are n-channel transistors.

Next, the first inverter circuit 102 and the second inverter circuit 103 shown in FIG. 1 will be described.

The first inverter circuit 102 and the second inverter circuit 103 shown in FIG. 1 are CMOS inverters. The CMOS inverters each include an n-channel transistor and a p-channel transistor. In each of the inverter circuits, an input signal is input to the gate of the n-channel transistor and to the gate of the p-channel transistor. One of the source and the drain of the n-channel transistor is electrically connected to a low voltage supply line. One of the source and the drain of the p-channel transistor is electrically connected to a high voltage supply line. The other of the source and the drain of the n-channel transistor is electrically connected to the other of the source and the drain of the p-channel transistor. The potential of the wire between the other of the source and the drain of the n-channel transistor and the other of the source and the drain of the p-channel transistor is an output signal of the inverter circuit.

The p-channel transistor in each CMOS inverter is preferably a transistor whose channel formation region is formed using silicon. The n-channel transistor in each CMOS inverter can be either a transistor whose channel formation region is formed using silicon or a transistor whose channel formation region is formed using a high-purity oxide semiconductor.

Figure 8:
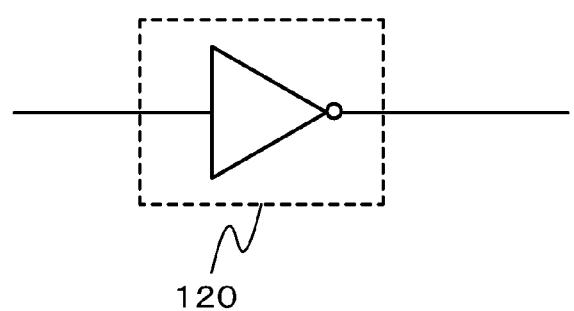
FIG. 8 shows an inverter.

Note that although FIG. 1 shows a flip-flop in which the first inverter circuit 102 and the second inverter circuit 103 are CMOS inverters, the present invention is not limited to this configuration. Specifically, the first inverter circuit 102 and the second inverter circuit 103 shown in FIG. 1 each can be replaced with an inverter 120 represented by a logic symbol shown in FIG. 8.

Next, the operation of the flip-flop shown in FIG. 1 will be described with reference to FIG. 2. Specifically, the operation of the flip-flop shown in FIG. 1 ranging from the retention of input data to the output of retained data will be described using the timing chart. In FIG. 2, D is a data signal input to the input terminal 21 (an input signal of the flip-flop), $S_M$ is the potential of the wire between the output of the first inverter circuit 102 and one of the source and the drain of the second transistor 101 (the potential of a point M in FIG. 1), and Q is a signal output to the output terminal 22 (an output signal of the second inverter circuit 103 or the output signal of the flip-flop).

At a time 2000, the inverted clock signal CK_B input to the gate of the first transistor 100 goes high, so that conduction between the source and the drain of the first transistor 100 is established. Consequently, the data signal D is input to the first inverter circuit 102. The first inverter circuit 102 outputs $S_M$, which is an inverted signal of the data signal D, to the point M.

During a period from the time 2000 to a time 2001, conduction between the source and the drain of the first transistor 100 remains because the inverted clock signal CK_B is high, so that when the data signal D goes from low to high, the potential $S_M$, which is the potential of the point M, changes from high to low. Over this period, the clock signal CK is low, so that there is no conduction between the source and the drain of the second transistor 101. As a result, the output signal of the second inverter circuit 103, that is, the potential of the output signal Q of the flip-flop does not change despite the change in the potential of the point M.

At the time 2001, the inverted clock signal CK_B goes low, so that conduction between the source and the drain of the first transistor 100 is interrupted. Consequently, the wire between the other of the source and the drain of the first transistor 100 and the input of the first inverter circuit 102 (a point L in FIG. 1) holds a high potential, as just before the conduction between the source and the drain of the first transistor 100 was interrupted, and becomes floating, that is, not in electrical contact with any component.

In this case, as described above, the first transistor 100 has a high-purity oxide semiconductor layer, and thus is characterized by extremely low off-state current. Therefore, the variations in the potential of the point L due to the first transistor 100 are extremely small. As a result, the potential of the data signal D, that is, data input to the flip-flop can be retained by the wire electrically connecting the other of the source and the drain of the first transistor 100 and the input of the first inverter circuit 102. The first inverter circuit 102 inverts a high-level signal held by this wire, and keeps outputting the potential $S_M$ that is low.

In addition, at the time 2001, conductivity between the source and the drain of the second transistor 101 is established because the clock signal CK goes high while the inverted clock signal CK_B goes low at the same time, so that the potential $S_M$, which is the potential of the point M, is input to the second inverter circuit 103. The second inverter circuit 103 inverts the potential $S_M$, which is the potential of the point M, and outputs a high-level signal having the same potential as the point L held by the wire electrically connecting the other of the source and the drain of the first transistor 100 and the input of the first inverter circuit 102. The signal output from the second inverter circuit 103 is the output signal Q of the flip-flop.

Then, at a time 2002, conductivity between the source and the drain of the first transistor 100 is established again because the inverted clock signal CK_B goes high, so that the data signal D is input to the first inverter circuit 102. At the same time, the clock signal CK goes low, and conductivity between the source and the drain of the second transistor 101 is interrupted. Thus, the wire between the other of the source and the drain of the second transistor 101 and the input of the second inverter circuit 103 (a point N in FIG. 1) holds a low potential as just before the conductivity between the source and the drain of the second transistor 101 was interrupted, and thus becomes floating, that is, not in electrical contact with any component.

Like the first transistor 100, the second transistor 101 has a high-purity oxide semiconductor layer, and thus is characterized by extremely low off-state current. Therefore, the variations in the potential of the point N due to the second transistor 101 are extremely small. As a result, the input data retained from the time 2001 to the time 2002 can be further retained from the time 2002 to a time 2003 by the wire electrically connecting the other of the source and the drain of the second transistor 101 and the input of the second inverter circuit 103. Consequently, even when the potential of the data signal D varies and the potential of the point M thus varies, the potential of the output signal Q of the flip-flop does not vary.

As described above, during the period in which the clock signal CK is high and the inverted clock signal CK_B is low, data input to the flip-flop according to this embodiment is retained by the wire electrically connecting the other of the source and the drain of the first transistor 100 and the input of the first inverter circuit 102, and is output from the flip-flop. During the period in which the clock signal CK is low and the inverted clock signal CK_B is high, data input to the flip-flop according to this embodiment is retained by the wire electrically connecting the other of the source and the drain of the second transistor 101 and the input of the second inverter circuit 103, and is output from the flip-flop. The flip-flop according to this embodiment is capable of retaining data input thereto for one cycle of the clock signal and outputting it.

In this embodiment, a transistor having a high-purity oxide semiconductor layer which provides extremely low off-state current is used. Thus, a flip-flop can be made without using a latch circuit, so that the number of transistors in the flip-flop can be dramatically reduced. This results in a reduction in the power consumption of the flip-flop and a reduction in the area in an integrated circuit occupied by flip-flops.

(Embodiment 2)

In this embodiment, an example of the configuration of a flip-flop which is different from that in Embodiment 1 will be described.

A flip-flop according to this embodiment includes the first transistor 100, the first inverter circuit 102, the second transistor 101, the second inverter circuit 103, a third transistor 104, and a fourth transistor 105, as shown in FIG. 3. Note that the flip-flop in this embodiment is different from the flip-flop in Embodiment 1 in having the third transistor 104 and the fourth transistor 105, but is otherwise the same as the flip-flop of Embodiment 1. The features common to those flip-flops can be seen in Embodiment 1, so that the description of these features is omitted in this embodiment.

The gate of the third transistor 104 and the gate of the fourth transistor 105 are each electrically connected to a reset terminal 23 via a wire serving as a reset signal line. Consequently, a reset signal is input to the gate of the third transistor 104 and the gate of the fourth transistor 105 via the wire.

One of the source and the drain of the third transistor 104 is electrically connected to the input of the first inverter 102 via a wire. Consequently, the potential of one of the source and the drain of the third transistor 104 and the potential of the point L are the same. The other of the source and the drain of the third transistor 104 is electrically connected to the low voltage supply line. One of the source and the drain of the fourth transistor 105 is electrically connected to the input of the second inverter 103 via a wire. Consequently, the potential of one of the source and the drain of the fourth transistor 105 and the potential of the point N are the same. The other of the source and the drain of the fourth transistor 104 is electrically connected to the high voltage supply line.

Note that although FIG. 3 shows a flip-flop in which the first inverter circuit 102 and the second inverter circuit 103 are CMOS inverters, the present invention is not limited to this configuration. Specifically, the first inverter circuit 102 and the second inverter circuit 103 shown in FIG. 3 each can be replaced with an inverter 120 represented by a logic symbol shown in FIG. 8.

Next, the characteristics of the third transistor 104 and fourth transistor 105 shown in FIG. 3 will be described.

The third transistor 104 and the fourth transistor 105 each use a high-purity oxide semiconductor for their channel formation regions. Consequently, in this embodiment, the first to fourth transistors 100, 101, 104, and 105 each have a channel formation region formed using a high-purity oxide semiconductor. As stated above, a transistor whose channel formation region is formed using an oxide semiconductor is characterized by its off-state current which is extremely low compared to the off-state current of a transistor whose channel formation region is formed using silicon, for example. In the following description of this embodiment, the first to fourth transistors 100, 101, 104, and 105 using a high-purity oxide semiconductor are n-channel transistors.

Figure 4:
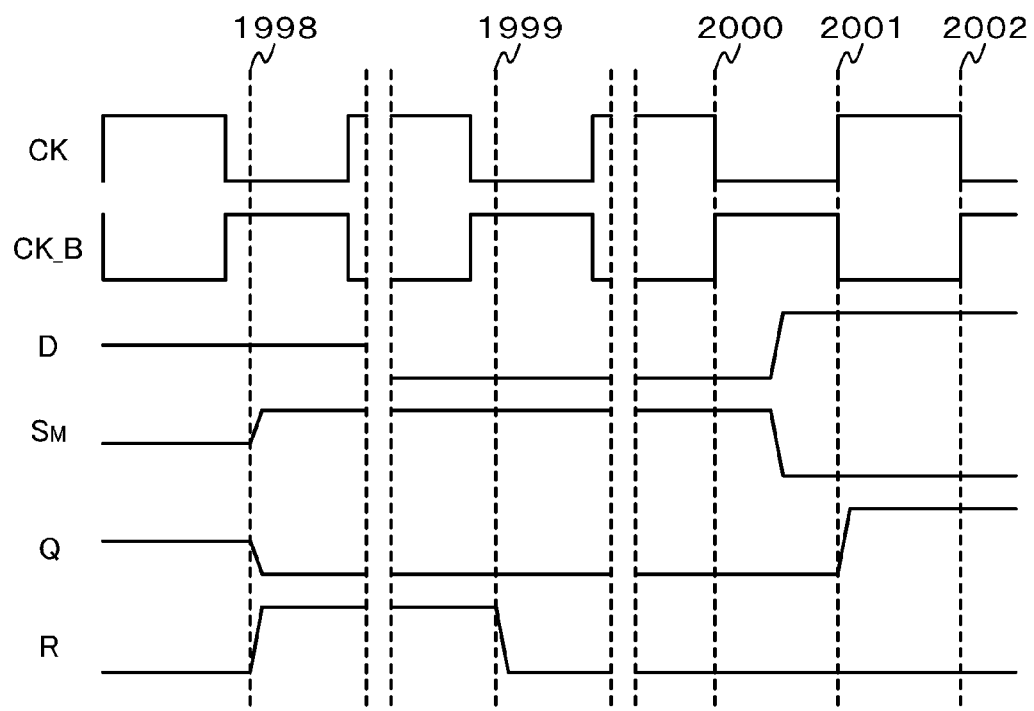
FIG. 4 is a timing chart of the flip-flop of FIG. 3.

Next, the operation of the flip-flop shown in FIG. 3 will be described with reference to FIG. 4. Specifically, the operation of the flip-flop shown in FIG. 3 ranging from the retention of input data performed after the flip-flop is put into a reset state by an inputted reset signal to the output of retained data will be described using the timing chart. Note that in FIG. 4, R is a reset signal input to the reset terminal 23.

After a time 1998, a reset signal R goes high, which means that the reset signal becomes active, so that conductivity between the source and the drain of the third transistor 104 is established. Consequently, a low-level signal is input to the first inverter circuit 102. The first inverter circuit 102 inverts the low-level signal, and outputs a high-level signal to the point M. Until a time 1999, the signal $S_M$, which is the potential of the point M, remains high independently of the on/off state of first transistor 100 which depends on the voltage level of the inverted clock signal CK_B. Further, conductivity between the source and the drain of the fourth transistor 105 is established, and a high-level signal is thus input to the second inverter circuit 103. The second inverter circuit 103 inverts the high-level signal, and outputs a low-level signal that is the output signal Q of the flip-flop. As described above, from the time 1998 to the time 1999, the reset signal R is high, which means that the reset signal is active, so that the output signal Q of the flip-flop remains low without respect to the on/off of second transistor 101 which depends on the voltage level of the clock signal CK. The flip-flop is thus in a reset state.

From the time 1999 that is sufficiently long after the time 1998, the reset signal R goes low, which means the reset signal becomes inactive, so that conductivity between the source and the drain of the third transistor 104 and between the source and the drain of the fourth transistor 105 is interrupted. As described above, the third transistor 104 and the fourth transistor 105 each have a high-purity oxide semiconductor layer, and thus are characterized by extremely low off-state current. This reduces both the variations in the potential of the point L due to the third transistor 104 and the variations in the potential of the point N due to the fourth transistor 105, to extremely small variations. Thus, the flip-flop normally operates during periods in which the flip-flop is not reset.

From the time 2000, there is no conductivity between the source and the drain of the third transistor 104 and fourth transistor 105. Hence, for the operation performed from the time 2000, reference can be made to the description of the operation of the flip-flop of Embodiment 1.

As described above, the flip-flop according to this embodiment includes the third transistor 104 and the fourth transistor 105 whose gates are controlled by the reset signal R. This allows the flip-flop to be reset.

In this embodiment, a transistor having a high-purity oxide semiconductor layer which provides extremely low off-state current is used. Thus, the number of transistors in the flip-flop including a reset terminal can be dramatically reduced. This results in a reduction in the power consumption of the flip-flop including a reset terminal and a reduction in the area in an integrated circuit occupied by flip-flops each including a reset terminal.

(Embodiment 3)

In this embodiment, an example of the configuration of a flip-flop which is different from that in Embodiment 1 will be described.

Figure 5:
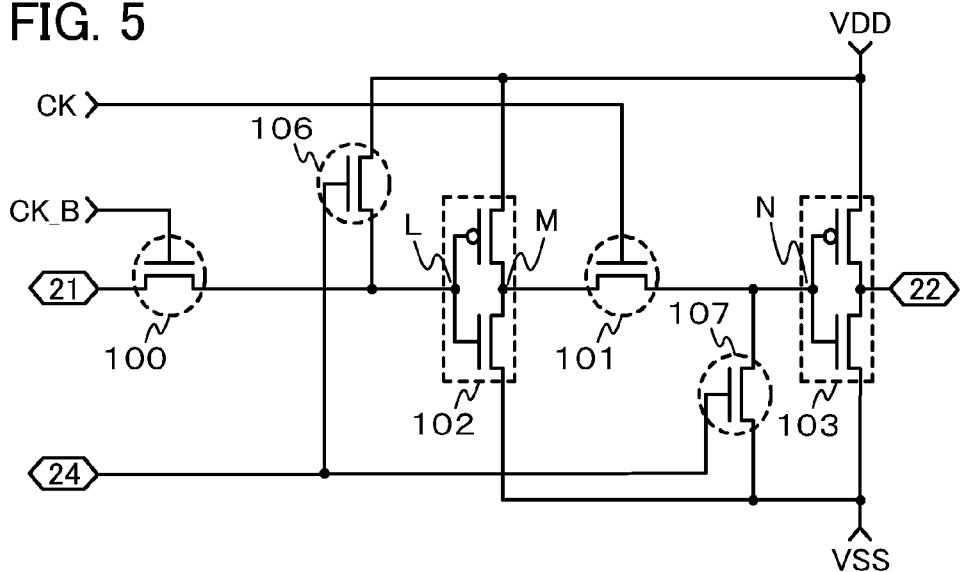
FIG. 5 shows an example of the structure of a flip-flop.

A flip-flop according to this embodiment includes the first transistor 100, the first inverter circuit 102, the second transistor 101, the second inverter circuit 103, a fifth transistor 106, and a sixth transistor 107, as shown in FIG. 5. Note that the flip-flop in this embodiment is different from the flip-flop in Embodiment 1 in having the fifth transistor 106 and the sixth transistor 107, but is otherwise the same as the flip-flop of Embodiment 1. The features common to those flip-flops can be seen in Embodiment 1, so that the description of these features is omitted in this embodiment.

The gate of the fifth transistor 106 and the gate of the sixth transistor 107 are each electrically connected to a set terminal 24 via a wire serving as a set signal line. Consequently, a set signal is input to the gate of the fifth transistor 106 and the gate of the sixth transistor 107 via the wire.

One of the source and the drain of the fifth transistor 106 is electrically connected to the input of the first inverter 102 via a wire. Consequently, the potential of one of the source and the drain of the fifth transistor 106 and the potential of the point L are the same. The other of the source and the drain of the fifth transistor 106 is electrically connected to the high voltage supply line. One of the source and the drain of the sixth transistor 107 is electrically connected to the input of the second inverter 103 via a wire. Consequently, the potential of one of the source and the drain of the sixth transistor 107 and the potential of the point N are the same. The other of the source and the drain of the sixth transistor 107 is electrically connected to the low voltage supply line.

Note that although FIG. 5 shows a flip-flop in which the first inverter circuit 102 and the second inverter circuit 103 are CMOS inverters, the present invention is not limited to this configuration. Specifically, the first inverter circuit 102 and the second inverter circuit 103 shown in FIG. 5 each can be replaced with an inverter 120 represented by a logic symbol shown in FIG. 8.

Next, the characteristics of the fifth transistor 106 and sixth transistor 107 shown in FIG. 5 will be described.

The fifth transistor 106 and the sixth transistor 107 each use a high-purity oxide semiconductor for their channel formation regions. Consequently, in this embodiment, the first transistor 100, the second transistor 101, the fifth transistor 106, and the sixth transistor 107 each have a channel formation region formed using a high-purity oxide semiconductor. As stated above, a transistor whose channel formation region is formed using an oxide semiconductor is characterized by its off-state current which is extremely low compared to the off-state current of a transistor whose channel formation region is formed using silicon, for example. In the following description of this embodiment, the first transistor 100, the second transistor 101, the fifth transistor 106, and the sixth transistor 107 using a high-purity oxide semiconductor are n-channel transistors.

Figure 6:
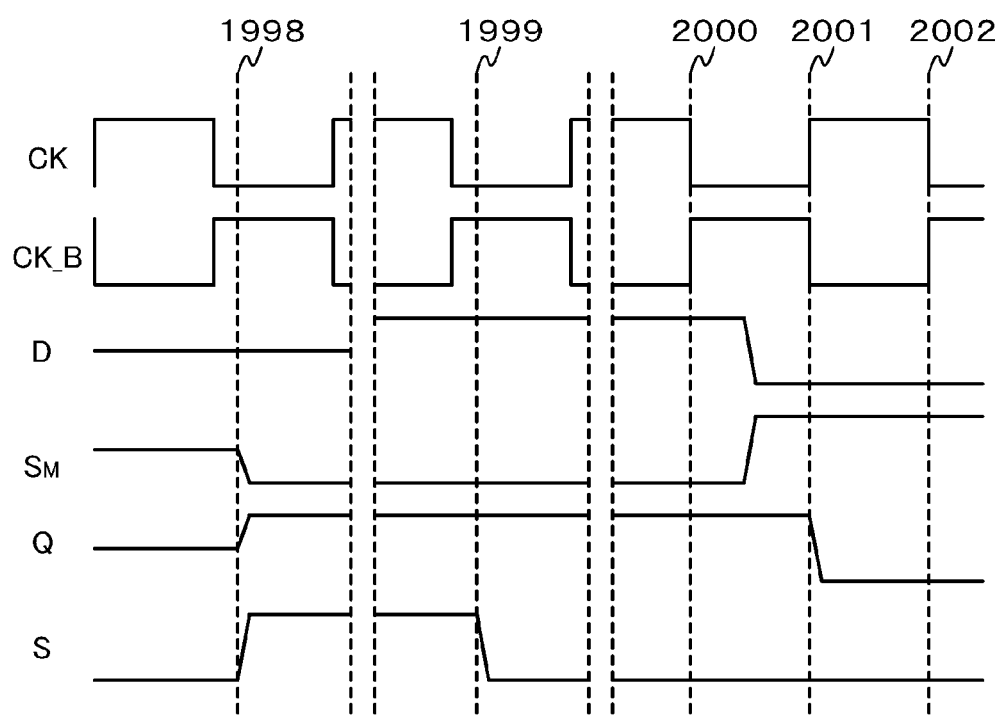
FIG. 6 is a timing chart of the flip-flop of FIG. 5.

Next, the operation of the flip-flop shown in FIG. 5 will be described with reference to FIG. 6. Specifically, the operation of the flip-flop shown in FIG. 5 ranging from the retention of input data performed after the flip-flop is put into a set state by an inputted set signal to the output of retained data will be described using the timing chart. Note that in FIG. 6, S is a set signal input to the set terminal 24.

After the time 1998, a set signal S goes high, which means that the set signal becomes active, so that conductivity between the source and the drain of the fifth transistor 106 is established. Thus, a high-level signal is input to the first inverter circuit 102. The first inverter circuit 102 inverts the high-level signal, and outputs a low-level signal to the point M. Until a time 1999, the signal $S_M$, which is the potential of the point M, remains low without respect to the on/off of first transistor 100 which depends on the voltage level of the inverted clock signal CK_B. Further, conductivity between the source and the drain of the sixth transistor 107 is established, and a low-level signal is thus input to the second inverter circuit 103. The second inverter circuit 103 inverts the low-level signal, and outputs a high-level signal that is the output signal Q of the flip-flop. As described above, from the time 1998 to the time 1999, the set signal S is high, which means that the set signal is active, so that the output signal Q of the flip-flop remains high without respect to the on/off of second transistor 101 which depends on the voltage level of the clock signal CK. The flip-flop is thus in a set state.

From the time 1999 that is sufficiently long after the time 1998, the set signal S goes low, which means the set signal becomes inactive, so that conductivity between the source and the drain of the fifth transistor 106 and between the source and the drain of the sixth transistor 107 is interrupted. As described above, the fifth transistor 106 and the sixth transistor 107 each have a high-purity oxide semiconductor layer, and thus are characterized by extremely low off-state current. This reduces both the variations in the potential of the point L due to the fifth transistor 106 and the variations in the potential of the point N due to the sixth transistor 107, to extremely small. Thus, the flip-flop normally operates during periods in which the flip-flop is not in a set state.

From a time 2000, there is no conductivity between the source and the drain of the fifth transistor 106 and sixth transistor 107. Hence, for the operation performed from the time 2000, reference can be made to the description of the operation of the flip-flop of Embodiment 1.

As described above, the flip-flop according to this embodiment includes the fifth transistor 106 and the sixth transistor 107 whose gates are controlled by the set signal S. This allows the flip-flop to be set.

In this embodiment, a transistor having a high-purity oxide semiconductor layer which provides extremely low off-state current is used. Thus, the number of transistors in the flip-flop including a set terminal can be dramatically reduced. This results in a reduction in the power consumption of the flip-flop including a set terminal and a reduction in the area in an integrated circuit occupied by flip-flops each including a set terminal.

(Embodiment 4)

In this embodiment, an example of the configuration of a flip-flop which is different from that in Embodiment 1 will be described.

A flip-flop according to this embodiment includes the first transistor 100, the first inverter circuit 102, the second transistor 101, the second inverter circuit 103, the third transistor 104, the fourth transistor 105, the fifth transistor 106, and the sixth transistor 107, as shown in FIG. 5. Note that the flip-flop in this embodiment is different from that in Embodiment 1 in having the third transistor 104, the fourth transistor 105, the fifth transistor 106, and the sixth transistor 107, but otherwise the same as the flip-flop of Embodiment 1. The features common to those flip-flops can be seen in Embodiment 1, so that description of these features is omitted in this embodiment. In addition, the configuration, the connections, and the operation of the third transistor 104 and the fourth transistor 105 have been described in Embodiment 2, so that the description thereof is omitted here. Further, the configuration, the connections, and the operation of the fifth transistor 106 and the sixth transistor 107 have been described in Embodiment 2, so that the description thereof is omitted here.

In this embodiment, a transistor having a high-purity oxide semiconductor layer which provides extremely low off-state current is used. Thus, the number of transistors in the flip-flop including a set terminal and a reset terminal can be dramatically reduced. This results in a reduction in the power consumption of the flip-flop including a set terminal and a reset terminal, and a reduction in the area in an integrated circuit occupied by flip-flops each including a set terminal and a reset terminal.

(Embodiment 5)

In this embodiment, an example of the configuration of a flip-flop which is different from that in Embodiment 1 will be described.

Figure 16:
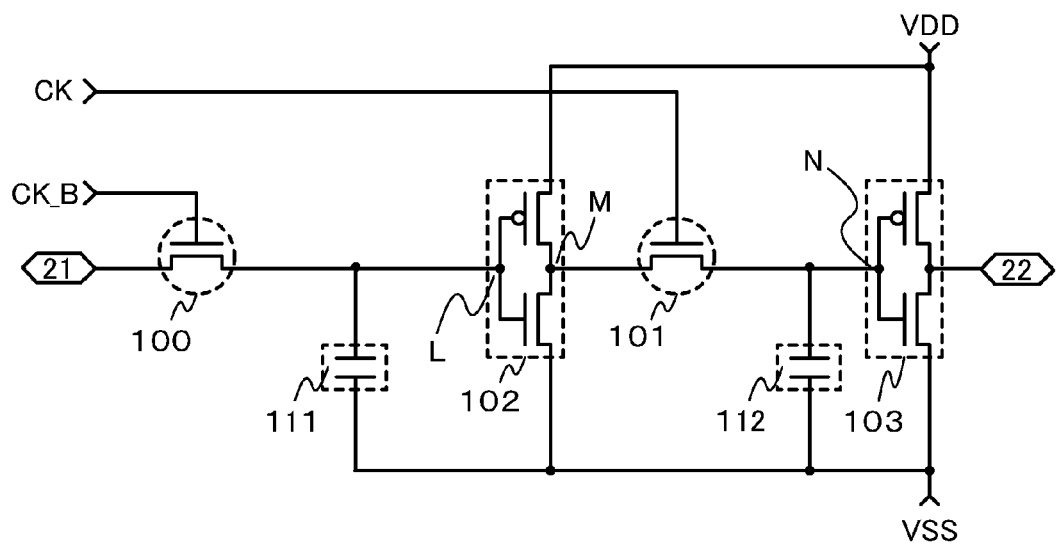
FIG. 16 shows an example of a structure of a flip-flop.

A flip-flop according to this embodiment includes the first transistor 100, the first inverter circuit 102, the second transistor 101, the second inverter circuit 103, a first capacitor 111, and a second capacitor 112, as shown in FIG. 16. Note that the flip-flop in this embodiment is different from that in Embodiment 1 in having the first capacitor 111 and the second capacitor 112, but otherwise the same as the flip-flop of Embodiment 1. The features common to those flip-flops can be seen in Embodiment 1, so that the description of these features is omitted in this embodiment.

The first capacitor 111 and the second capacitor 112 each have a pair of electrodes. One electrode of the first capacitor 111 is electrically connected to the input of the first inverter circuit 102, and the other electrode of the first capacitor 111 is electrically connected to the low voltage supply line. One electrode of the second capacitor 112 is electrically connected to the input of the second inverter circuit 103, and the other electrode of the second capacitor 112 is electrically connected to the low voltage supply line. The flip-flop of this embodiment includes the first capacitor 111 and the second capacitor 112 as stated above, and thus is capable of easily retaining the input data of the flip-flop.

It is acceptable that the same potential (e.g. the ground potential) is applied to the low voltage supply line, which is electrically connected to the other electrode of the first capacitor 111, and to the low voltage supply line, which is electrically connected to the other electrode of the second capacitor 112, as shown in FIG. 16. The present invention however is not limited to this configuration; it is also acceptable that different potentials are applied to these low voltage supply lines. In addition, FIG. 16 shows the configuration in which the potential applied to the low voltage supply line electrically connected to the other electrode of the first capacitor 111 and the low voltage supply line electrically connected to the other electrode of the second capacitor 112 is the same as that applied to the low voltage supply line electrically connected to one of the source and the drain of the n-channel transistor in the first inverter circuit 102 and the low voltage supply line electrically connected to one of the source and the drain of the n-channel transistor in the second inverter circuit 103. The present invention however is not limited to this configuration; it is also acceptable that these potentials are different.

Figure 7:
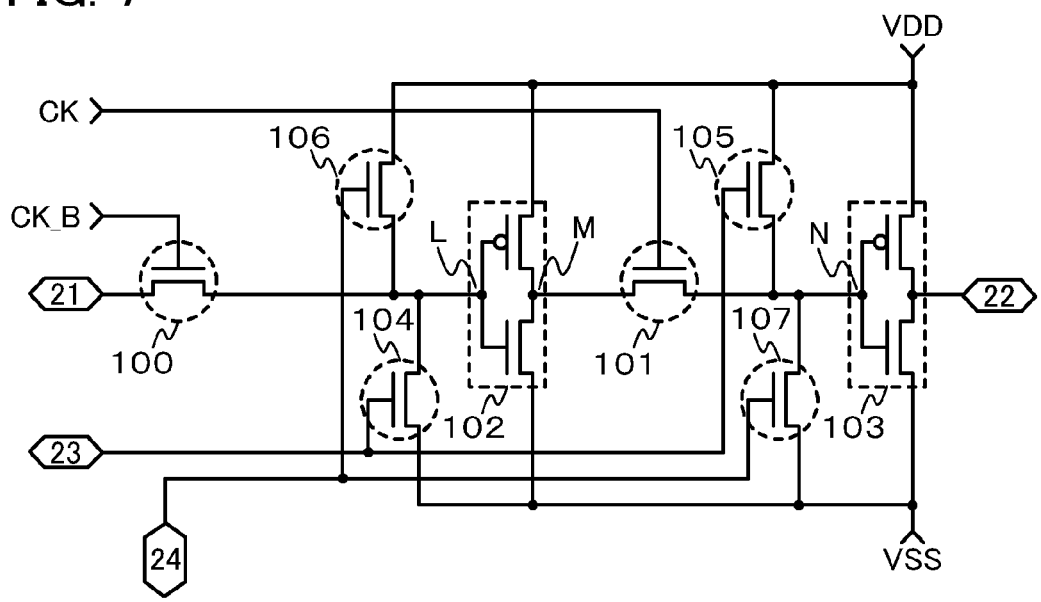
FIG. 7 shows an example of the structure of a flip-flop.

The configuration of this embodiment is the configuration of Embodiment 1 shown in FIG. 1 which additionally includes the first capacitor 111 and the second capacitor 112, but the present invention is not limited to this configuration. In other words, the configuration of this embodiment can be the configuration of Embodiment 2 shown in FIG. 3, the configuration of Embodiment 3 shown in FIG. 5, or the configuration of Embodiment 4 shown in FIG. 7, each of which additionally includes the first capacitor 111 and the second capacitor 112.

(Embodiment 6)

In this embodiment, the characteristics of the transistors of Embodiments 1 to 5, that is, transistors having a high-purity oxide semiconductor layer will be described in detail.

In the high-purity oxide semiconductor layer, the amount of impurity adversely affecting the electric characteristics of the transistor using an oxide semiconductor is reduced to an extremely low level. A typical example of the impurity adversely affecting the electric characteristics is hydrogen. A hydrogen atom may act as a donor, which provides carriers in an oxide semiconductor. An oxide semiconductor is n-type when containing a large amount of hydrogen. Thus, a transistor using an oxide semiconductor containing a large amount of hydrogen is normally on. Further, the on/off ratio of the transistor cannot be sufficiently high. Therefore, in this specification, a "high-purity oxide semiconductor" refers to an oxide semiconductor in which the amount of hydrogen is reduced as much as possible, and which is intrinsic or substantially intrinsic. An example of the high-purity oxide semiconductor is an oxide semiconductor whose carrier concentration is less than $1\times10^{14}/cm^3$, preferably less than $1\times10^{12}/cm^3$, more preferably less than $1\times10^{11}/cm^3$ or less than $6.0\times10^{10}/cm^3$. When the oxide semiconductor forming the channel formation region of a transistor has been subjected to a drastic reduction in its hydrogen content, the transistor is characterized by an extremely low off-state current compared to the off-state current of a transistor whose channel formation region is formed using, for example, silicon. In this embodiment, a transistor using a high-purity oxide semiconductor is an n-channel transistor.

Note that in this specification, off-state current (also referred to as leakage current) is defined, in the case of a n-channel transistor whose threshold voltage Vth has a positive value, as a current flowing, at room temperature, between the source and the drain of a transistor when a predetermined voltage between −20 and −5 V is applied to the gate of the transistor. Note that room temperature is between 15° C. and 25° C. The current value per micrometer of channel width (w) at room temperature that a transistor using an oxide semiconductor according to the present invention provides is 100 zA/μm or less, and preferably 10 zA/μm or less.

Note that when the off-state current and the drain voltage is known, the resistance of a transistor in the off state (off-state resistance R) can be determined by Ohm's law; and when the cross-sectional area A and channel length L of the channel formation region are known, the off-state resistivity ρ can be determined by the expression ρ=RA/L (R is the off-state resistance). The off-state resistivity is preferably $1\times10^9$ Ω·m or higher (or $1\times10^{10}$ Ω·m). In this case, the cross-section area A can be determined by the expression A=dW, where d is the thickness of the channel formation region and W is the channel width.

Further, it is preferable that the energy gap of the oxide semiconductor layer be 2 eV or more, preferably 2.5 eV or more, and more preferably 3 eV or more.

The temperature characteristics of the transistor using a high-purity oxide semiconductor are favorable. Specifically, from the current vs. voltage characteristics of the transistor at a temperature ranging from −25 to 150° C., nearly no variation in the on-state current, off-state current, field-effect mobility, S value, and threshold voltage are detected. This means that the current vs. voltage characteristics are hardly deteriorated by the temperature.

Next, the hot-carrier degradation of a transistor using an oxide semiconductor will be described.

The hot-carrier degradation corresponds to a phenomenon where, in a channel and in the vicinity of a drain, highly-accelerated electrons are injected into a gate insulating film and then become fixed charges; or to a phenomenon where highly-accelerated electrons form a trap level at the interface between an oxide semiconductor film and a gate insulating film, which involves deterioration of transistor characteristics, e.g., variations in threshold voltage or gate leakage. The hot-carrier degradation is caused by channel-hot-electron injection (CHE injection) or drain-avalanche-hot-carrier injection (DAHC injection), for example.

The band gap of silicon is as narrow as 1.12 eV. Consequently, avalanche-like generation of electrons, called avalanche breakdown, easily occurs and electrons that are so highly-accelerated that they are capable of breaking through a barrier to a gate insulating film are increased in number. On the other hand, an oxide semiconductor in this embodiment has a wide band gap. As a result, the avalanche breakdown is unlikely to occur and resistance to the hot-carrier degradation is higher than that of silicon.

Note that the band gap of silicon carbide, which is one of materials having high withstand voltage, is substantially equal to that of an oxide semiconductor, but electrons are less likely to be accelerated in an oxide semiconductor because the mobility of electrons in an oxide semiconductor is approximately one-hundredth of that in silicon carbide. Further, a barrier between an oxide semiconductor and an oxide film, which is a gate insulating film, is larger than a barrier between any of silicon carbide, gallium nitride, and silicon and an oxide film; therefore, in the case of an oxide semiconductor, the number of electrons injected to the oxide film is extremely small, hot-carrier degradation is less likely to be caused than in the case of silicon carbide, gallium nitride, or silicon, and it can be said that drain withstand voltage is high. Consequently, it is possible to avoid the necessity of intentionally providing low-concentration impurity regions between an oxide semiconductor serving as a channel and a source electrode and between the oxide semiconductor and a drain electrode, which makes the transistor structure extremely simple and reduces the number of manufacturing steps.

From the above, it can be said that a transistor using an oxide semiconductor has high drain withstand voltage, specifically, a drain withstand voltage of 100 V or more, and preferably 500 V or more, and more preferably 1 kV or more.

(Embodiment 7)

In this embodiment, an example of the structure and manufacturing method of each of the transistors according to Embodiments 1 to 5 (the first to sixth transistors 100, 101, 104, 105, 106, and 107) is described. In other words, an example of the structure and manufacturing method of a transistor using a high-purity oxide semiconductor is described.

Figure 9A:
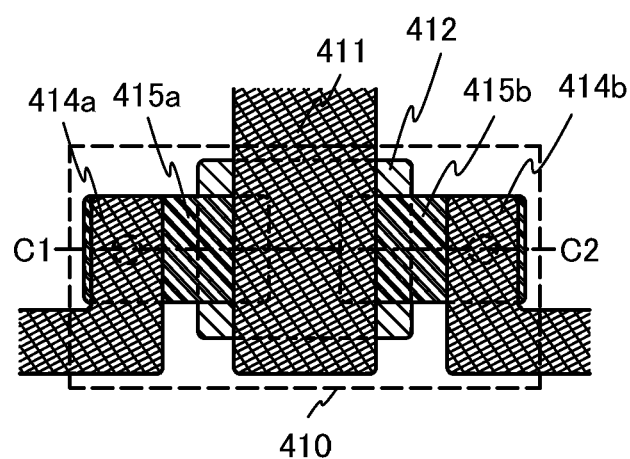
FIGS. 9A and 9B are a plan view and a cross-sectional view showing an example of a transistor.
Figure 9B:
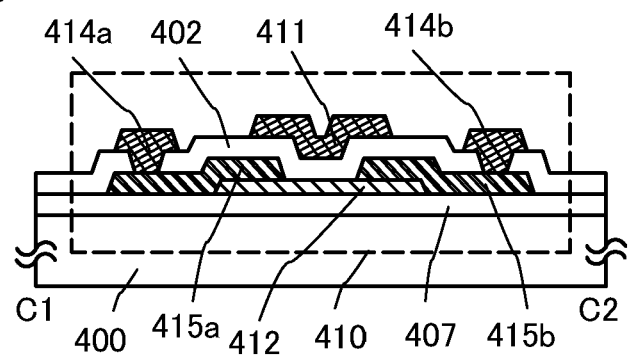

First, FIGS. 9A and 9B show an example of the planar structure and the cross-sectional structure of a transistor. FIG. 9A is a plan view of a transistor 410 having a top-gate structure and FIG. 9B is a cross-sectional view showing section C1-C2 in FIG. 9A.

The transistor 410 includes, over a substrate 400, an insulating layer 407, an oxide semiconductor layer 412, a first electrode (one of the source electrode and drain electrode) 415a, a second electrode (the other of the source electrode and the drain electrode) 415b, a gate insulating layer 402, and a gate electrode 411. A first wiring 414a and a second wiring 414b are provided so as to be in contact with and electrically connected to the first electrode 415a and the second electrode 415b, respectively.

Note that although the transistor 410 in FIG. 9A is a single-gate transistor, the present invention is not limited to this configuration. The transistor can be a multi-gate transistor including a plurality of gate electrodes and a plurality of channel formation regions.

Next, the fabricating process of the transistor 410 will be described with reference to FIGS. 10A to 10E.

First, an insulating layer 407 serving as a base film is formed over the substrate 400.

Although there is no particular limitation on the substrate that can be used as the substrate 400, the substrate needs to have heat resistance high enough to withstand at least heat treatment performed later. In the case where the temperature of the heat treatment performed later is high, a substrate having a strain point of 730° C. or higher is preferably used. Specific examples of the substrate 400 include a glass substrate, a crystalline glass substrate, a ceramic substrate, a quartz substrate, a sapphire substrate, and a plastic substrate. Further, specific examples of the material for the glass substrate include aluminosilicate glass, aluminoborosilicate glass, and barium borosilicate glass.

The insulating layer 407 is preferably an oxide insulating layer such as a silicon oxide layer, a silicon oxynitride layer, an aluminum oxide layer, or an aluminum oxynitride layer. The insulating layer 407 can be formed by plasma CVD, sputtering, or the like. In order to prevent the insulating layer 407 from containing a large amount of hydrogen, the insulating layer 407 is preferably formed by sputtering. In this embodiment, a silicon oxide layer is formed as the insulating layer 407 by sputtering. Specifically, the substrate 400 is transferred to a process chamber and a sputtering gas which contains high-purity oxygen and from which hydrogen and moisture have been removed is introduced, and a target of silicon or silicon oxide is used, thus forming a silicon oxide layer as the insulating layer 407 over the substrate 400. Note that the substrate 400 can be kept at room temperature or can be heated during deposition.

A specific example of the deposition condition for depositing a silicon oxide layer is as follows: quartz (preferably, synthetic quartz) is used as the target; the substrate temperature is 108° C.; the distance between a target and the substrate 400 (T–S distance) is 60 mm; the pressure is 0.4 Pa; the high-frequency power is 1.5 kW; the atmosphere is oxygen and argon (the flow rate ratio of oxygen to argon is 25 sccm:25 sccm=1:1); and an RF sputtering method is used. The thickness of the film is 100 nm Note that a silicon target can be used as the target instead of the quartz (preferably, synthetic quartz) target. Further, an oxygen gas can be used as a sputtering gas instead of a mixed gas of oxygen and argon. Here, a sputtering gas for forming the insulating layer 407 is a high-purity gas in which the concentration of impurities such as hydrogen, water, hydroxyl, or hydride is reduced to the extent that it is in parts per million, and preferably in parts per billion.

Further, it is preferable that the insulating layer 407 be formed while moisture remaining in the process chamber is removed so that the insulating layer 407 may be prevented from containing hydrogen, water, hydroxyl, hydride, and the like.

In order to remove moisture remaining in the process chamber, a sorption vacuum pump is used. A cryopump, an ion pump, or a titanium sublimation pump can be used. Further, as an evacuation means, a turbo pump is preferably used in combination with a cold trap. A deposition chamber which is evacuated with a cryopump is preferable because hydrogen atoms, compounds including a hydrogen atom such as water ($H_2O$), or the like are exhausted from the deposition chamber and hydrogen atoms are thus hardly included in the insulating layer 407 deposited in the deposition chamber.

Examples of the sputtering process include an RF sputtering in which a high-frequency power source is used for a sputtering power supply, DC sputtering, and pulsed DC sputtering in which a bias is applied in a pulsed manner. RF sputtering is mainly used in the case where an insulating film is deposited, and DC sputtering is mainly used in the case where a metal film is deposited.

In addition, a multi-source sputtering apparatus in which a plurality of targets of different materials can be set can be used. With the multi-source sputtering apparatus, films of different materials can be deposited in the same chamber so as to be superposed, or a film can be formed by electric discharge of plural kinds of materials at the same time in the same chamber.

Further, a sputtering apparatus provided with a magnet system inside the chamber and used for magnetron sputtering, or a sputtering apparatus used for ECR sputtering in which plasma generated with the use of microwaves is used without using glow discharge can be used.

Further, examples of the deposition method using sputtering include reactive sputtering in which a target substance and a sputtering gas component are chemically reacted with each other during the deposition to form a thin compound film thereof, and bias sputtering in which voltage is also applied to a substrate during the deposition.

The insulating layer 407 can be either a single layer or a multilayer. For example, the insulating layer 407 can be a multilayer including a nitride insulating layer such as a silicon nitride layer, a silicon nitride oxide layer, an aluminum nitride layer, or an aluminum nitride oxide layer and the above oxide insulating layer are stacked in this order over the substrate 400.

For example, a sputtering gas containing high-purity nitrogen is introduced over the substrate and a silicon nitride layer is deposited using a silicon target. Then, the sputtering gas is changed to a gas contains high-purity oxygen gas, and a silicon oxide layer is deposited. In this step also, it is preferable that a silicon nitride layer or a silicon oxide layer be deposited while moisture remaining in the process chamber is removed as in the above-described case. In addition, the substrate may also be heated during the deposition.

Then, an oxide semiconductor layer is formed over the insulating layer 407 by sputtering.

Further, in order that hydrogen, hydroxyl, and moisture may be contained in the oxide semiconductor layer as little as possible, it is preferable that the substrate 400 over which the insulating layer 407 is formed be preheated in a preheating chamber of a sputtering apparatus as pretreatment for the film deposition so that impurities such as hydrogen and moisture adsorbed to the substrate 400 may be evacuated from the chamber. Note that as an evacuation means, a cryopump is preferably provided in the preheating chamber. Further, this preheating can be performed on the substrate 400 prior to the deposition of the gate insulating layer 402 formed later. Further, this preheating is preferably performed similarly on the substrate 400 over which layers up to the first electrode 415a and the second electrode 415b are formed. Note that this preheating treatment can be omitted.

Note that before the oxide semiconductor layer is formed by sputtering, dust attached to a surface of the insulating layer 407 is preferably removed by reverse sputtering in which an argon gas is introduced and plasma is generated. The reverse sputtering refers to a method in which, without application of voltage to a target, a high-frequency power source is used for application of voltage to a substrate in an argon atmosphere in order to generate plasma in the vicinity of the substrate to modify a surface. Note that instead of an argon atmosphere, nitrogen atmosphere, helium atmosphere, oxygen atmosphere, or the like can be used.

A target for forming the oxide semiconductor layer can be a metal oxide target a main component of which is zinc oxide, e.g. a target containing $In_2O_3$, $Ga_2O_3$, and ZnO at a ratio of 1:1:1 [mol %], that is, In, Ga, and Zn at a ratio of 1:1:0.5 [atomic %]. Alternatively the target can be a target containing In, Ga, and Zn at a ratio of 1:1:1 [atomic %] or a target containing In, Ga, and Zn at a ratio of 1:1:2 [atomic %].

Further, a target which contains $SiO_2$ at 2 to 10 wt % can be used. The filling factor of the metal oxide target is 90 to 100%, and preferably 95 to 99.9%. The use of a metal oxide target with a high filling factor enables the formed oxide semiconductor layer to have high density.

Note that the oxide semiconductor layer can be formed in a rare gas (typically, argon) atmosphere, an oxygen atmosphere, or an atmosphere of a rare gas and oxygen. Here, a sputtering gas for forming the oxide semiconductor layer is a high-purity gas in which the concentration of impurities such as hydrogen, water, hydroxyl, or hydride is reduced to the extent that it is in parts per million, and preferably in parts per billion.

The oxide semiconductor layer is formed over the substrate 400 in such a manner that the substrate is held in a process chamber maintained under reduced pressure, a sputtering gas from which hydrogen and moisture have been removed is introduced while moisture remaining in the process chamber is removed, and metal oxide is used as a target. In order to remove moisture remaining in the process chamber, a sorption vacuum pump is preferably used. A cryopump, an ion pump, or a titanium sublimation pump is preferably used. In a deposition chamber which is evacuated with a cryopump, hydrogen atoms, compounds including hydrogen atoms such as water ($H_2O$) (more preferably, compounds including carbon atoms in addition), and the like are exhausted. Consequently, the concentration of impurities contained in the oxide semiconductor layer deposited in the deposition chamber can be reduced. Further, the substrate temperature can be kept at room temperature or can be increased to a temperature less than 400° C. during the deposition of the oxide semiconductor layer.

As an example of the deposition condition of the oxide semiconductor layer, the following condition can be given: the temperature of the substrate is room temperature; the distance between the substrate and the target is 110 mm; the pressure is 0.4 Pa; the direct current (DC) power supply is 0.5 kW; and the atmosphere is oxygen and argon (the flow rate ratio of oxygen to argon is 15 sccm:30 sccm). Note that a pulse direct current (DC) power supply is preferable because dust is reduced and the film thickness can be made uniform. The thickness of the oxide semiconductor layer is preferably 2 to 200 nm, preferably 5 to 30 nm Note that an appropriate thickness of the oxide semiconductor layer varies depending on the material used therefor, and the thickness is thus determined as appropriate depending on the material.

In the above description, the oxide semiconductor is formed using In—Ga—Zn—O based oxide that is ternary metal oxide, but the oxide semiconductor can alternatively be any one of an In—Sn—Ga—Zn—O material that is a quaternary metal oxide; an In—Ga—Zn—O layer, an In—Sn—Zn—O material, In—Al—Zn—O material, an Sn—Ga—Zn—O material, an Al—Ga—Zn—O material, or an Sn—Al—Zn—O material that are ternary metal oxides; an In—Zn—O material, an Sn—Zn—O material, an Al—Zn—O material, a Zn—Mg—O material, an Sn—Mg—O material, or an In—Mg—O material that are binary metal oxides; an In—O material; an Sn—O material; a Zn—O material; and the like. These oxide semiconductors can contain Si. These oxide semiconductors can be amorphous or crystalline. Further, these oxide semiconductors can be non-single-crystal or single crystal.

Note that as the oxide semiconductor layer, a thin film expressed by $InMO_3(ZnO)_m$ (m>0) can be used. Here, M represents one or more metal elements selected from Ga, Al, Mn, and Co. For example, Ga, Ga and Al, Ga and Mn, or Ga and Co can be given as M.

Figure 10A:
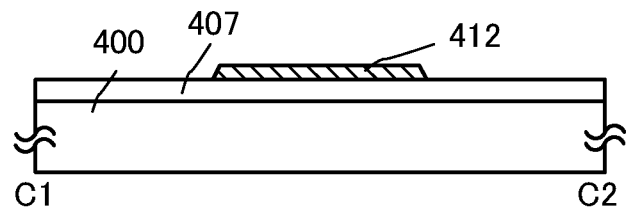
FIGS. 10A to 10E are cross-sectional views showing an example of the method of fabricating a transistor.
Figure 10B:
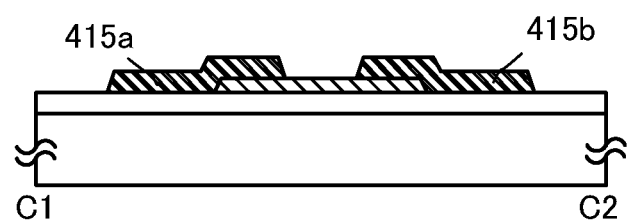

Then, an oxide semiconductor layer is processed into an island-shaped oxide semiconductor layer 412 in the first photolithography process (see FIG. 10A). Note that a resist mask for forming the island-shaped oxide semiconductor layer 412 may be formed using inkjet method. The formation of the resist mask by inkjet method does not use a photomask; thus, manufacturing cost can be reduced.

Note that the etching of the oxide semiconductor layer can be dry etching, wet etching, or both wet etching and dry etching.

In the case of dry etching, a parallel plate reactive ion etching (RIE) method or an inductively coupled plasma (ICP) etching method can be used. In order to etch the film into a desired shape, the etching conditions (the amount of electric power applied to a coil-shaped electrode, the amount of electric power applied to an electrode on a substrate side, the temperature of the electrode on the substrate side, or the like) is adjusted as appropriate.

The etching gas for dry etching is preferably a gas including chlorine (a chlorine-based gas such as chlorine ($Cl_2$), boron trichloride ($BCl_3$), silicon tetrachloride ($SiCl_4$), or carbon tetrachloride ($CCl_4$)) but can alternatively be a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like.

The etchant used for wet etching can be a mixed solution of phosphoric acid, acetic acid, and nitric acid, or an ammonium hydrogen peroxide mixture (a solution in which 31 wt % hydrogen peroxide, 28 wt % ammonia water, and water are mixed in a volume ratio of 5:2:2), or the like. The etchant used for wet etching can alternatively be ITO-07N (produced by KANTO CHEMICAL CO., INC.). The etching conditions (e.g., an etchant, an etching period, and a temperature) are adjusted as appropriate in accordance with the material for the oxide semiconductor.

In the case of wet etching, an etchant is removed together with the material which is etched off by cleaning. The waste liquid containing the etchant and the material which is etched off may be purified and the material can be reused. When a material (e.g., a rare metal such as indium) contained in the oxide semiconductor layer is collected from the waste liquid after the etching and reused, the resources can be efficiently used.

In this embodiment, the oxide semiconductor layer is processed into the island-shaped oxide semiconductor layer 412 by wet etching using a mixed solution of phosphoric acid, acetic acid, and nitric acid as an etchant.

Then, the first heat treatment is performed on the oxide semiconductor layer 412. The temperature of the first heat treatment is between 400 to 750° C., preferably 400° C. or higher and lower than the strain point of the substrate. Here, the substrate is put in an electric furnace which is a kind of heat treatment apparatus and heat treatment is performed on the oxide semiconductor layer in a nitrogen atmosphere at 450° C. for one hour. After that, the oxide semiconductor layer is prevented from being exposed to air and from containing water or hydrogen again. Thus, the oxide semiconductor layer is obtained. By this first heat treatment, hydrogen, water, hydroxyl, and the like can be removed from the oxide semiconductor layer 412.

Note that the heat treatment apparatus is not limited to an electric furnace, and an apparatus can be provided with a device for heating an object by heat conduction or thermal radiation from a heater such as a resistance heater. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus with which an object is heated by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. The gas can be an inert gas (typically, a rare gas such as argon) or a nitrogen gas.

For example, the first heat treatment can employ GRTA, in which the substrate is transferred into an inert gas heated to a high temperature of 650 to 700° C., and heated for several minutes there, and then the substrate is transferred out of the inert gas heated to a high temperature. GRTA enables short-time high-temperature heat treatment.

In the first heat treatment, it is preferable that water, hydrogen, and the like be not contained in the atmosphere. In addition, nitrogen or a rare gas such as helium, neon, or argon which is introduced into a heat treatment apparatus preferably has a purity of 6N (99.9999%) or higher, more preferably 7N (99.99999%) or higher (that is, the concentration of impurities is 1 ppm or less, and preferably 0.1 ppm or less).

Note that depending on the conditions of the first heat treatment or a material of the oxide semiconductor layer, the oxide semiconductor layer 412 may be crystallized to be microcrystalline or a polycrystalline. For example, the oxide semiconductor layer may become a microcrystalline oxide semiconductor layer having a crystallinity of 80% or more. Note that, the island-shaped oxide semiconductor layer 412 may become an amorphous oxide semiconductor layer, being not crystallized by the first heat treatment. The island-shaped oxide semiconductor layer 412 may become an amorphous oxide semiconductor layer in which a microcrystalline portion is mixed (with a grain diameter of 1 nm to 20 nm inclusive, typically 2 nm to 4 nm inclusive).

The first heat treatment performed on the oxide semiconductor layer can be performed on the oxide semiconductor layer not yet been processed into the island-shaped oxide semiconductor layer. In this case, the substrate is taken out from the heat treatment apparatus after the first heat treatment and then subjected to the first photolithography process. In addition, the first heat treatment can be performed either after the source electrode and the drain electrode are stacked over the oxide semiconductor layer, or after the gate insulating layer is formed over the source electrode and the drain electrode.

Although the first heat treatment is performed mainly for the purpose of removing impurities such as hydrogen, water, and hydroxyl from the oxide semiconductor layer, it may generate oxygen defects in the oxide semiconductor layer. An additional oxidation treatment is therefore preferably performed after the first heat treatment. Specifically, heat treatment in oxygen atmosphere or an atmosphere containing nitrogen and oxygen (e.g., nitrogen to oxygen is 4 to 1 in volume ratio) may be performed as the additional oxidation treatment after the first heat treatment, for example. Plasma treatment in an oxygen atmosphere can alternatively be employed.

The first heat treatment is effective in dehydrating or dehydrogenating the oxide semiconductor layer.

Then, a conductive film is formed over the insulating layer 407 and the oxide semiconductor layer 412. The conductive film may be formed by sputtering or vacuum evaporation. Examples of the material for the conductive film include a metal material such as Al, Cu, Cr, Ta, Ti, Mo, W, or Y; an alloy material including any of the metal materials; and a conductive metal oxide. In order to prevent hillock or whisker formation, the material for the conductive film can alternatively be an Al material to which an element of Si, Ti, Ta, W, Mo, Cr, Nd, Sc, Y, or the like is added. The use of such an Al material improves the heat resistance of the conductive film. The material for the conductive film can alternatively be a conductive metal oxide. Examples of the conductive metal oxide include indium oxide ($In_2O_3$), tin oxide ($SnO_2$), zinc oxide (ZnO), an indium oxide-tin oxide alloy ($In_2O_3$—$SnO_2$, abbreviated as ITO), an indium oxide-zinc oxide alloy ($In_2O_3$—ZnO), and the metal oxide material including silicon or silicon oxide.

The conductive film can be either a single layer or a stack of two or more layers. For example, the conductive film can be a single-layer aluminum film containing silicon; a two-layer film of an aluminum film overlaid by a titanium film; or a three-layer film of a titanium film overlaid by an aluminum film overlaid by another titanium film. Alternatively, the conductive film can be a stack of a metal layer of Al, Cu, or the like and a refractory metal layer of Cr, Ta, Ti, Mo, W, or the like. In this embodiment, a 150-nm-thick titanium film is formed by sputtering as the conductive film.

Next, a resist mask is formed over the conductive film in the second photolithography process and selective etching is performed, thereby forming the first electrode 415a and the second electrode 415b. Then, the resist mask is removed (see FIG. 10B). The first electrode 415a serves as one of the source electrode and drain electrode, while the second electrode 415b serves as the other of the source electrode and drain electrode. At that time, the first electrode 415a and the second electrode 415b are preferably etched so as to have tapered ends because coverage with the gate insulating layer formed thereon will be improved. Note that resist mask for forming the first electrode 415a and the second electrode 415b may be formed by inkjet method. The formation of the resist mask by inkjet method does not use a photomask; thus, manufacturing cost can be reduced.

In the etching of the conductive film, the material for each layer and the etching conditions need to be adjusted as appropriate in order to prevent the oxide semiconductor layer 412 from being removed and the insulating layer 407 provided thereunder from being exposed. Therefore, in this embodiment, an In—Ga—Zn—O-based oxide semiconductor is used as the oxide semiconductor layer 412, a titanium film is used as the conductive film, and the etchant used is an ammonium hydrogen peroxide mixture (a mixture of ammonia, water, and a hydrogen peroxide solution) so that part of the oxide semiconductor layer 412 may not be etched. However, the present invention is not limited thereto. Part of the oxide semiconductor layer 412 can be etched in the second photolithography process and an oxide semiconductor layer having a groove (a depression portion) can be formed.

Ultraviolet, KrF laser light, or ArF laser light is used for light exposure for forming the resist mask in the second photolithography process. A channel length L of the transistor formed later depends on the width of an interval between the lower end of the first electrode 415a and the lower end of the second electrode 415b which are formed over the oxide semiconductor layer 412. Note that in the case of light exposure whereby the channel length L of less than 25 nm is provided, extreme ultraviolet with extremely short wavelengths of several nanometers to several tens of nanometers is used for light exposure for forming the resist mask in the second photolithography process. Light exposure with extreme ultraviolet leads to a high resolution and a large depth of focus. Consequently, the channel length L of the transistor formed later can be 10 to 1000 nm. In this case, an increase in the operation speed of the transistor can be achieved, and further, a reduction in the power consumption of the transistor can be achieved because of extremely low off-state current.

Figure 10C:
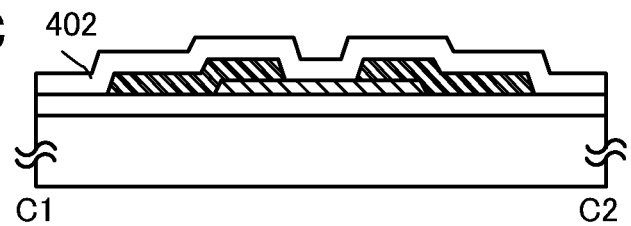
Figure 10D:
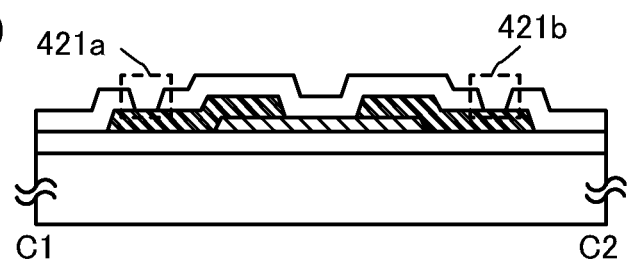

Then, the gate insulating layer 402 is formed over the insulating layer 407, the oxide semiconductor layer 412, the first electrode 415a, and the second electrode 415b (see FIG. 10C).

The gate insulating layer 402 can be a single layer or a stack of a silicon oxide layer, a silicon nitride layer, a silicon oxynitride layer, a silicon nitride oxide layer, or an aluminum oxide layer by plasma CVD, sputtering, or the like.

When the gate insulating layer 402 is formed, hydrogen is preferably not contained therein. In view of this, the gate insulating layer 402 is preferably deposited by sputtering in which hydrogen in an atmosphere used for the deposition can be minimized. In the case of forming a silicon oxide film by sputtering, the target used is a silicon target or a quartz target, and the sputtering gas used is oxygen or a mixed gas of oxygen and argon.

The gate insulating layer 402 can be a stack of a silicon oxide layer overlaid by a silicon nitride layer over the substrate 400. For example, the gate insulating layer 402 can be a 100-nm-thick stack of a first gate insulating layer which is a silicon oxide layer ($SiO_x$ (x>0)) with a thickness of 5 to 300 nm overlaid by a second gate insulating layer which is a silicon nitride layer ($SiN_y$ (y>0)) with a thickness of 50 to 200 nm. In this embodiment, the gate insulating layer 402 is a 100-nm-thick silicon oxide layer formed by RF sputtering under a pressure of 0.4 Pa, a high-frequency power of 1.5 kW, and in atmosphere of oxygen and argon (the flow rate ratio of oxygen to argon is 25 sccm:25 sccm=1:1).

Next, in the third photolithography process, a resist mask is formed and selective etching is performed, thereby removing part of the gate insulating layer 402. Thus, openings 421a and 421b reaching the first electrode 415a and the second electrode 415b are formed (see FIG. 10D). Note that the formation of the resist mask by inkjet method does not use a photomask; thus, manufacturing cost can be reduced.

Then, a conductive film is formed over the gate insulating layer 402 and in the openings 421a and 421b. In a next step, the gate electrode 411, the first wiring 414a, and the second wiring 414b are formed in the fourth photolithography process.

The gate electrode 411, the first wiring 414a, and the second wiring 414b can be a single layer or a stack using a metal material such as molybdenum, titanium, chromium, tantalum, tungsten, aluminum, copper, neodymium, or scandium, or an alloy material whose main component is any of these materials. Specific examples of the two-layer structure of the gate electrode 411, the first wiring 414a, and the second wiring 414b include a stack of an aluminum layer overlaid by a molybdenum layer, a stack of a copper layer overlaid by a molybdenum layer, a stack of a copper layer overlaid by a titanium nitride layer or a tantalum nitride layer, and a stack of a titanium nitride layer overlaid by a molybdenum layer. Specific examples of the three-layer structure include a stack of a tungsten layer or a tungsten nitride layer, an alloy layer of aluminum and silicon or aluminum and titanium, and a titanium nitride layer or a titanium layer. Note that the gate electrode can be formed using a light-transmitting conductive film. A specific example of the light-transmitting conductive film is a film of a light-transmitting conductive oxide.

In this embodiment, a 150-nm-thick titanium film formed by sputtering is used for the gate electrode 411, the first wiring 414a, and the second wiring 414b.

Then, the second heat treatment (preferably, at 200 to 400° C., for example, at 250 to 350° C.) is performed in an inert gas atmosphere or in an oxygen gas atmosphere. In this embodiment, the second heat treatment is performed in a nitrogen atmosphere at 250° C. for one hour. Note that the second heat treatment can be performed after a protective insulating layer or a planarization insulating layer is formed over the transistor 410.

An additional heat treatment can be performed at 100 to 200° C. in air for 1 hour to 30 hours. This heat treatment can be performed at a fixed heating temperature or follow temperature cycles where the temperature repeatedly rises from room temperature to a heating temperature of 100 to 200° C. and drops from the a heating temperature to room temperature.

Figure 10E:
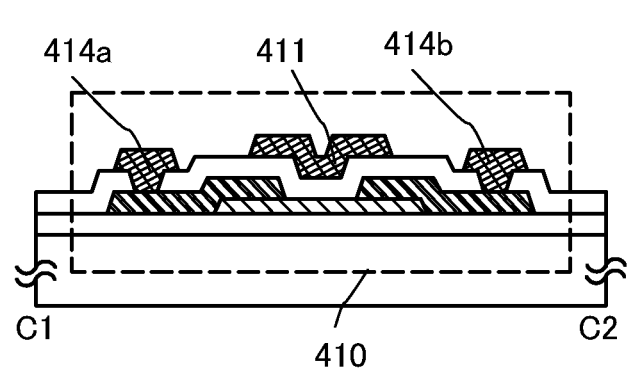

Through the above process, the transistor 410 including the high-purity oxide semiconductor layer 412 in which the concentration of hydrogen, moisture, hydride, and hydroxide is reduced can be formed (see FIG. 10E). The transistor 410 can be used as the first to sixth transistors 100, 101, 104, 105, 106, and 107 described in Embodiments 1 to 5, for example.

A protective insulating layer or a planarization insulating layer can be provided over the transistor 410. The protective insulating layer can be a single layer structure or a stack of any of a silicon oxide layer, a silicon nitride layer, a silicon oxynitride layer, a silicon nitride oxide layer, and an aluminum oxide layer. The planarization insulating layer can be formed using a heat-resistant organic material, such as polyimide, acrylic resin, benzocyclobutene resin, polyamide, or epoxy resin. Alternatively, the planarization insulating layer can be formed using a low-dielectric constant material (a low-k material), a siloxane-based resin, phosphosilicate glass (PSG), borophosphosilicate glass (BPSG), or the like. Further alternatively, the planarization insulating layer can be a stack of a plurality of insulating films formed using any of these materials.

Here, the siloxane-based resin corresponds to a resin including a Si—O—Si bond which is formed using a siloxane-based material as a starting material. The siloxane-based resin can include an organic group (e.g., an alkyl group or an aryl group) or a fluoro group as a substituent. The organic group can include a fluoro group.

There is no particular limitation on the method for forming the planarization insulating layer. The method or tool (apparatus) used for forming the planarization insulating layer is selected, according to the material employed, from the following ones: sputtering, SOG, spin coating, dipping, spray coating, a droplet discharge method (e.g., inkjet method, screen printing, or offset printing), a doctor knife, a roll coater, a curtain coater, a knife coater, and the like.

As described above, by removing moisture remaining in the reaction atmosphere in the formation of the oxide semiconductor layer, the concentration of hydrogen and hydride in the oxide semiconductor layer can be reduced.

By using a transistor including an oxide semiconductor layer described in this embodiment, a flip-flop can be made without being provided with a latch circuit. This results in a reduction in the number of transistors in the flip-flop and in power consumption. Further, reducing the number of transistors leads to a reduction in the area in an integrated circuit occupied by flip-flops.

(Embodiment 8)

In this embodiment, another example of the structure and manufacturing method of each of the transistors according to Embodiments 1 to 5 (the first to sixth transistors 100, 101, 104, 105, 106, and 107) is described. In other words, another example of the structure and manufacturing method of a transistor using a high-purity oxide semiconductor is described with reference to FIGS. 11A to 11E.

Figure 11A:
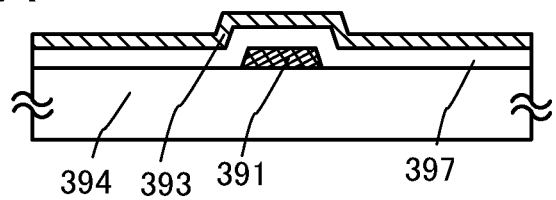
FIGS. 11A to 11E are cross-sectional views showing an example of the method of fabricating a transistor.
Figure 11B:
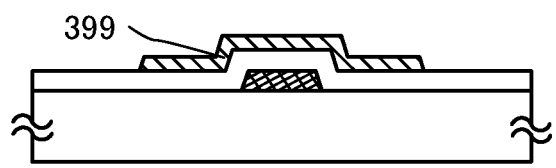
Figure 11C:
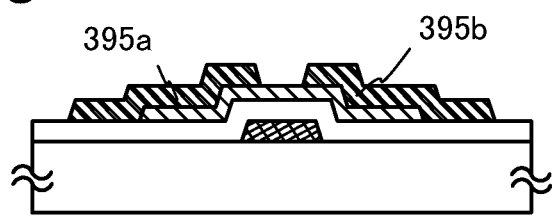
Figure 11D:
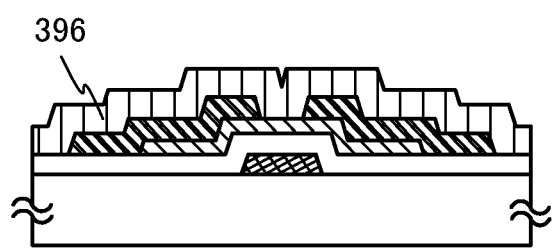
Figure 11E:
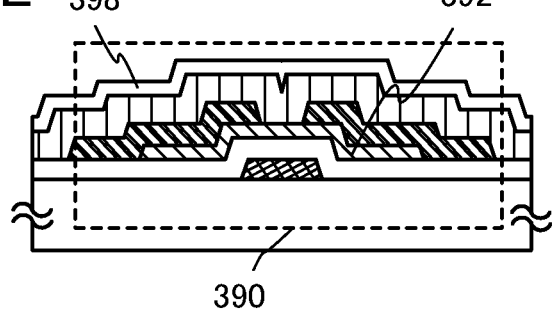

FIGS. 11A to 11E show an example of a cross-sectional structure of a transistor. A transistor 390 shown in FIG. 11E is a bottom gate transistor and is also referred to as an inverted staggered transistor. The transistor 390 can be used as the first transistor 100, the second transistor 101, or the like described in Embodiment 1, for example. Note that although the transistor 390 is a single-gate transistor, the present invention is not limited to the structure. The transistor can be a multi-gate transistor including a plurality of gate electrodes and a plurality of channel formation regions.

A process of manufacturing the transistor 390 over a substrate 394 will be described below with reference to FIGS. 11A to 11E.

First, a conductive film is formed over the substrate 394, and then, a gate electrode 391 is formed in the first photolithography process. It is preferable that an end portion of the formed gate electrode be tapered because coverage with a gate insulating layer formed thereover is improved. Note that a resist mask may be formed by inkjet method. The formation of the resist mask by inkjet method does not use a photomask; thus, manufacturing cost can be reduced.

The substrate 394 can be formed using a material similar to that for the substrate 400 described in Embodiment 7. The gate electrode 391 can be formed using a material and a deposition method similar to those of the gate electrode 411 described in Embodiment 7.

Note that an insulating film serving as a base film can be provided between the substrate 394 and the gate electrode 391. The base film has a function of preventing diffusion of impurity elements from the substrate 394, and can be a single layer or a stack of any of a silicon nitride film, a silicon oxide film, a silicon nitride oxide film, and a silicon oxynitride film.

Then, a gate insulating layer 397 is formed over the gate electrode 391.

The gate insulating layer 397 can be a single layer or a stack of any of a silicon oxide layer, a silicon nitride layer, a silicon oxynitride layer, a silicon nitride oxide layer, and an aluminum oxide layer by plasma CVD, sputtering, or the like. Note that in order to prevent the gate insulating layer 397 from containing a large amount of hydrogen, the gate insulating layer 397 is preferably formed by sputtering. In the case of forming a silicon oxide film by sputtering, the target used is a silicon target or a quartz target, and the sputtering gas used is oxygen or a mixed gas of oxygen and argon.

The gate insulating layer 397 can be a stack of a silicon nitride layer overlaid by a silicon oxide layer, which are over the gate electrode 391. For example, the gate insulating layer 397 can be a 100-nm-thick stack of a first gate insulating layer which is a silicon nitride layer ($SiN_y$ (y>0)) with a thickness of 50 to 200 nm formed by sputtering and overlaid by a second gate insulating layer which is a silicon oxide layer ($SiO_x$ (x>0)) with a thickness of 5 to 300 nm.

Then, the oxide semiconductor layer 393 with a thickness of 2 to 200 nm, and preferably of 5 to 30 nm is formed over the gate insulating layer 397 (see FIG. 11A).

The oxide semiconductor layer 393 can be formed using a material and a formation method similar to those of the oxide semiconductor layer (the island-shaped oxide semiconductor layer 412) described in Embodiment 7.

As an example of the deposition condition in the case where the oxide semiconductor layer 393 is formed by sputtering, the following condition can be given: the distance between the substrate and the target is 100 mm, the pressure is 0.6 Pa, the direct current (DC) power supply is 0.5 kW, and the atmosphere is oxygen (the proportion of the oxygen flow is 100%). Note that a pulse direct current (DC) power supply is preferable because dust can be reduced and the film thickness can be made uniform. Note that an appropriate thickness of the oxide semiconductor layer varies depending on the material used therefor; and the thickness is determined as appropriate depending on the material.

Note that before the oxide semiconductor layer 393 is formed, dust attached to a surface of the gate insulating layer 397 is preferably removed by reverse sputtering in which an argon gas is introduced and plasma is generated.

Further, in order that hydrogen, hydroxyl, and moisture may be contained in the gate insulating layer 397 and the oxide semiconductor layer 393 as little as possible, it is preferable that the substrate 394 over which the gate electrode 391 is formed or the substrate 394 over which layers up to the gate insulating layer 397 are formed be preheated in a preheating chamber of a sputtering apparatus as pretreatment for the film formation so that impurities such as hydrogen and moisture adsorbed to the substrate 394 are evacuated from the chamber. The temperature of the preheating may be 100 to 400° C., and preferably 150 to 300° C. As an evacuation means, a cryopump is preferably provided in the preheating chamber. Further, this preheating may be similarly performed on the substrate 394 over which layers up to and including a first electrode 395a and a second electrode 395b are formed, before a protective insulating layer 396 is formed.

Then, an oxide semiconductor layer is processed into an island-shaped oxide semiconductor layer 399 in the second photolithography process (see FIG. 11B). Note that the processing method of the island-shaped oxide semiconductor layer 399 is similar to that of the island-shaped oxide semiconductor layer 412 described in Embodiment 7.

Note that it is preferable that reverse sputtering be performed before a conductive film is formed in the subsequent step, in order to remove a resist residue or the like attached on the surfaces of the oxide semiconductor layer 399 and the gate insulating layer 397.

Then, a conductive film is formed over the gate insulating layer 397 and the oxide semiconductor layer 399. The conductive film can be formed by sputtering or a vacuum evaporation method. The material for the conductive film can be an element selected from aluminum, chromium, copper, tantalum, titanium, molybdenum, and tungsten; an alloy containing any of these elements as its component; an alloy containing a plurality of these elements in combination; and the like. Further, the material for the conductive film can contain one or a combination of materials selected from manganese, magnesium, zirconium, beryllium, and thorium. Further, the conductive film can be a light-transmitting conductive film. A specific example of the light-transmitting conductive film is a film of a light-transmitting conductive oxide.

The conductive film can be either a single layer or a stack of two or more layers. For example, the conductive film can be a single-layer aluminum film containing silicon; a two-layer film of an aluminum film overlaid by a titanium film; or a three-layer film of a titanium film overlaid by an aluminum film overlaid by another titanium film.

Then, in the third photolithography process, a resist mask is formed over the conductive film, and selective etching is performed, thereby forming the first electrode 395a and the second electrode 395b. Then, the resist mask is removed (see FIG. 11C). In the etching of the conductive film, the material for each layer and the etching conditions need to be adjusted as appropriate in order to prevent the oxide semiconductor layer 399 from being removed and the gate insulating layer 397 provided thereunder from being exposed. Therefore, in this embodiment, an In—Ga—Zn—O-based oxide semiconductor is used as the oxide semiconductor layer 399, a titanium film is used as the conductive film, and an ammonium hydrogen peroxide mixture (a mixture of ammonia, water, and a hydrogen peroxide solution) is used as an etchant so that part of the oxide semiconductor layer 399 may not be etched. However, the present invention is not limited thereto. Part of the oxide semiconductor layer 399 can be etched in the third photolithography process and an oxide semiconductor layer having a groove (a depression portion) can be formed.

Ultraviolet, KrF laser light, or ArF laser light is used for light exposure for forming the resist mask in the third photolithography process. A channel length L of the transistor to be formed later depends on the width of an interval between a lower end of the first electrode 395a and a lower end of the second electrode 395b which are formed over the oxide semiconductor layer 399. Note that when light exposure is performed to provide the channel length L of less than 25 nm, extreme ultraviolet with extremely short wavelengths of several nanometers to several tens of nanometers is used for light exposure for forming the resist mask in the third photolithography process. Light exposure with extreme ultraviolet leads to a high resolution and a large depth of focus. Therefore, the channel length L of the transistor formed later can be 10 to 1000 nm, which leads to an increase in operation speed of the circuit, and a reduction in the power consumption of the transistor because of extremely small off-state current.

In order to reduce the number of the photomasks used in the photolithography process or the number of fabrication steps, etching process can be performed using a resist mask made by a multi-tone mask which is a light-exposure mask such that light transmitted by the mask has a plurality of intensities. A resist mask made by a multi-tone mask has a plurality of thicknesses and can be further changed in shape by etching; thus, such a resist mask can be used in a plurality of etching processes for different patterns. Thus, a resist mask applicable to at least two or more kinds of different patterns can be made by a single multi-tone mask. This reduces the number of exposure masks and also the number of corresponding photolithography processes, thereby simplifying the process.

In addition, after the first electrode 395a and the second electrode 395b are formed by the etching, plasma treatment using a gas such as $N_2O$, $N_2$, or Ar can be performed to remove water or the like adsorbed on an exposed surface of the oxide semiconductor layer 399. Plasma treatment can be performed using a mixed gas of oxygen and argon. In this embodiment, either plasma treatment is performed.

After the plasma treatment, a protective insulating layer 396 which is in contact with the exposed oxide semiconductor layer 399, the first electrode 395a, and the second electrode 395b is formed without exposure to air (see FIG. 11D). At that time, it is preferable that the protective insulating layer 396 be formed while moisture remaining in the process chamber is removed so that the oxide semiconductor layer 399 and the protective insulating layer 396 can be prevented from including hydrogen, hydroxyl, or moisture. In order to remove moisture remaining in the process chamber, a sorption vacuum pump is preferably used. A cryopump, an ion pump, or a titanium sublimation pump is preferably used. In a deposition chamber which is evacuated with a cryopump, hydrogen atoms, compounds including hydrogen atoms such as water ($H_2O$), and the like are exhausted. Accordingly, the concentration of impurities contained in the protective insulating layer 396 formed in the deposition chamber can be reduced.

In this embodiment, an oxide insulating layer is formed as the protective insulating layer 396. For example, a silicon oxide layer is formed as the protective insulating layer 396 in the following conditions: the substrate 394 over which layers up to the island-shaped oxide semiconductor layer 399, the first electrode 395a, and the second electrode 395b are formed is kept at room temperature or heated to a temperature lower than 100° C., a sputtering gas including high-purity oxygen from which hydrogen and moisture are removed is introduced, and a silicon semiconductor target is used. Note that instead of a silicon oxide layer, a silicon oxynitride layer, an aluminum oxide layer, an aluminum oxynitride layer, or the like can be used as the oxide insulating layer.

For example, the deposition conditions of the above silicon oxide layer is as follows: a boron-doped silicon target which has a purity of 6N (the resistivity is 0.01 Ω·cm) is used; the distance between the substrate and the target (T–S distance) is 89 mm; the pressure is 0.4 Pa, the direct-current (DC) power supply is 6 kW, the atmosphere is oxygen (the proportion of the oxygen flow is 100%); and pulsed DC sputtering is employed. The thickness of the silicon oxide layer is 300 nm. Note that instead of a silicon target, quartz (preferably, synthetic quartz) can be used. The sputtering gas used is an oxygen gas or a mixed gas of oxygen and argon.

Additional heat treatment is preferably performed at 100 to 400° C. while the protective insulating layer 396 and the oxide semiconductor layer 399 are in contact with each other. This heat treatment allows impurities such as hydrogen, moisture, hydroxyl, or hydride contained in the oxide semiconductor layer 399 to be diffused into the protective insulating layer 396, so that the impurities contained in the oxide semiconductor layer 399 are further reduced.

Through the above process, the transistor 390 including the oxide semiconductor layer 392 in which the concentration of hydrogen, moisture, hydroxyl, and hydroxide is reduced can be formed (see FIG. 11E). As described in this embodiment, by removing moisture remaining in the reaction atmosphere in the deposition of the oxide semiconductor layer, the concentration of hydrogen and hydride in the oxide semiconductor layer can be reduced. As a result, an intrinsic or substantially intrinsic semiconductor layer can be obtained.

Note that an insulating layer may be additionally provided over the protective insulating layer 396. In this embodiment, a protective insulating layer 398 is formed over the protective insulating layer 396. The insulating layer 398 can be a silicon nitride film, a silicon nitride oxide film, an aluminum nitride film, an aluminum nitride oxide film, or the like.

For the formation of the insulating layer 398, the substrate 394 over which layers up to the protective insulating layer 396 are formed is heated to a temperature of 100 to 400° C., a sputtering gas including high-purity nitrogen from which hydrogen and moisture have been removed is introduced, and a silicon semiconductor target is used, whereby a silicon nitride film is formed. In this step also, it is preferable that the insulating layer 398 be formed while moisture remaining in the process chamber is removed as in the case of the protective insulating layer 396. By heating the substrate 394 to 100 to 400° C. in the deposition of the insulating layer 398, hydrogen or moisture in the oxide semiconductor layer 399 can be diffused into the insulating layer 398. In that case, heat treatment is not necessarily performed directly after the formation of the protective insulating layer 396.

In the case where a silicon oxide layer is formed as the protective insulating layer 396 and a silicon nitride layer is formed as the insulating layer 398, the silicon oxide layer and the silicon nitride layer can be formed in the same process chamber using the same silicon target. First, a sputter gas containing oxygen is introduced and a silicon oxide layer is formed using a silicon target provide in the process chamber, and then the sputter gas is switched to a sputter gas containing nitrogen and a silicon nitride layer is formed using the same silicon target. Since the silicon oxide layer and the silicon nitride layer can be formed in succession without exposure to air, impurities such as hydrogen or moisture can be prevented from being adsorbed on a surface of the silicon oxide layer. Note that after the silicon oxide layer is formed as the protective insulating layer 396 and the silicon nitride layer is formed thereover as the insulating layer 398, heat treatment (at a temperature of 100 to 400° C.) for diffusion of hydrogen or moisture in the oxide semiconductor layer into the oxide insulating layer is preferably performed.

After the formation of the protective insulating layer 396, additional heat treatment can be performed at 100 to 200° C. in air for 1 to 30 hours. This heat treatment can be performed at a fixed heating temperature or follow temperature cycles where the temperature repeatedly rises from room temperature to a heating temperature of 100 to 200° C. and drops from the a heating temperature to room temperature. Further, this heat treatment can be performed under reduced pressure before the oxide insulating layer is formed. Heat treatment under reduced pressure shortens the heating time.

Since the above process can be performed at a temperature of 400° C. or less, the process can be preferably applied to a fabricating process using a glass substrate having a side longer than 1 m and a thickness of 1 mm or less. In addition, since the whole process can be performed at a treatment temperature of 400° C. or less, a display panel can be manufactured with less energy consumption.

By using the transistor including an oxide semiconductor layer described in this embodiment, a flip-flop can be made without being provided with a latch circuit. This results in a reduction in the number of transistors in the flip-flop and in power consumption. Further, reducing the number of transistors leads to a reduction in the area in an integrated circuit occupied by flip-flops.

(Embodiment 9)

In this embodiment, another example of the structure and manufacturing method of each of the transistors according to Embodiments 1 to 5 (the first to sixth transistors 100, 101, 104, 105, 106, and 107) is described. In other words, another example of the structure and manufacturing method of a transistor using a high-purity oxide semiconductor is described with reference to FIGS. 12A to 12D.

FIGS. 12A to 12D show an example of the cross-sectional structure of a transistor. A transistor 360 shown in FIG. 12A to 12D is a channel-protective type (channel-stop type) bottom gate transistor and is also referred to as an inverted staggered transistor. The transistor 360 can be used as the first transistor 100, the second transistor 101, or the like described in Embodiment 2. Note that although the transistor 360 is a single-gate transistor, the present invention is not limited to the structure. The transistor can be a multi-gate transistor including a plurality of gate electrodes and a plurality of channel formation regions.

A process of manufacturing the transistor 360 over a substrate 320 will be described below with reference to FIGS. 12A to 12D.

First, a conductive film is formed over the substrate 320, and then, a gate electrode 361 is formed in the first photolithography process. The material for the substrate 320 can be similar to that for the substrate 394 described in Embodiment 7. The material and the deposition method for the gate electrode 361 can be similar to those for the gate electrode 391 described in Embodiment 7.

Then, a gate insulating layer 322 is formed over the gate electrode 361. The material for the gate insulating layer 322 can be similar to that for the gate insulating layer 397 described in Embodiment 7. In this embodiment, a silicon oxynitride layer with a thickness of 100 nm or less is formed by plasma CVD as the gate insulating layer 322.

Then, an oxide semiconductor layer with a thickness of 2 to 200 nm is formed over the gate insulating layer 322 and processed into an island-shaped oxide semiconductor layer 332 in the second photolithography process. The material and the formation method for the island-shaped oxide semiconductor layer 332 can be similar to those for the island-shaped oxide semiconductor layer 399 described in Embodiment 7. In this embodiment, the oxide semiconductor layer 332 is formed by sputtering using an In—Ga—Zn—O-based metal oxide target.

Then, the oxide semiconductor layer 332 is dehydrated or dehydrogenated. The temperature of the first heat treatment for dehydrating or dehydrogenating the oxide semiconductor layer is 400 to 750° C., preferably 400° C. or higher and lower than the strain point of the substrate. Here, the substrate is put in an electric furnace which is a kind of heat treatment apparatus and heat treatment is performed on the oxide semiconductor layer 332 in a nitrogen atmosphere at 450° C. for one hour (see FIG. 12A). Note that this process causes oxygen defects in the oxide semiconductor layer 332, thereby reducing the resistance of the oxide semiconductor layer 332.

Then, plasma treatment using a gas such as $N_2O$, $N_2$, or Ar is performed. By this plasma treatment, water or the like adhering to an exposed surface of the oxide semiconductor layer is removed. Plasma treatment can be performed using a mixed gas of oxygen and argon.

Then, an oxide insulating layer is formed over the gate insulating layer 322 and the oxide semiconductor layer 332. Then, in the third photolithography process, a resist mask is formed, and selective etching is performed, thereby forming the oxide insulating layer 366. Then, the resist mask is removed.

In this embodiment, a 200-nm-thick silicon oxide film is deposited as the oxide insulating layer 366 by sputtering. The substrate temperature in the deposition is room temperature to 300° C.; in this embodiment, the substrate temperature is 100° C. The silicon oxide film can be deposited by sputtering in a rare gas (typically, argon) atmosphere, an oxygen atmosphere, or an atmosphere of a rare gas (typically, argon) and oxygen. The target used can be a silicon oxide target or a silicon target. For example, with the use of a silicon target, a silicon oxide film can be formed by sputtering in an atmosphere of oxygen and nitrogen. The oxide insulating layer 366 being in contact with the oxide semiconductor layer having low resistance can be, in addition to a silicon oxide film, an inorganic insulating film which does not contain impurities such as moisture, a hydrogen ion, and OH⁻ and which prevents their entry from the outside. Typical examples of the oxide insulating layer 366 include a silicon oxide film, a silicon oxynitride film, an aluminum oxide film, and an aluminum oxynitride film.

At this time, it is preferable that the oxide insulating layer 366 be formed while moisture remaining in the process chamber is removed so that the oxide semiconductor layer 332 and the oxide insulating layer 366 may be prevented from containing hydrogen, hydroxyl, or moisture. The method for removing moisture remaining in the process chamber can be the same as that described in other embodiments.

Then, the second heat treatment (preferably at 200 to 400° C., e.g. 250 to 350° C.) is preferably performed in an inert gas atmosphere or in an oxygen gas atmosphere. For example, the second heat treatment is performed in a nitrogen atmosphere at 250° C. for one hour. In the second heat treatment, a portion of the oxide semiconductor layer (a channel formation region) is heated while being in contact with the oxide insulating layer 366. At that time, a region covered with the oxide semiconductor layer 366 is supplied with oxygen by the oxide insulating layer, and thus has increased resistance.

In addition, because of oxygen defects, heat treatment in a nitrogen atmosphere, an inert gas atmosphere, or under reduced pressure can further reduce the resistance of an exposed region of the oxide semiconductor layer 332 which is not covered with the oxide insulating layer 366.

Figure 12A:
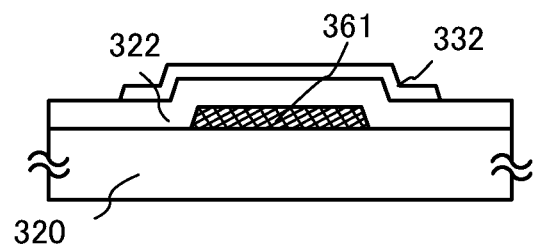
FIGS. 12A to 12D are cross-sectional views showing an example of the method of fabricating a transistor.
Figure 12B:
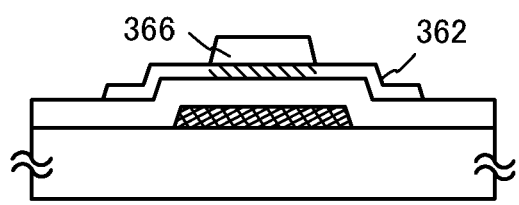
Figure 12C:
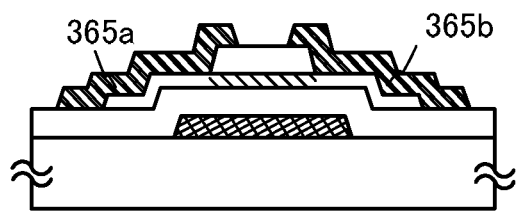
Figure 12D:
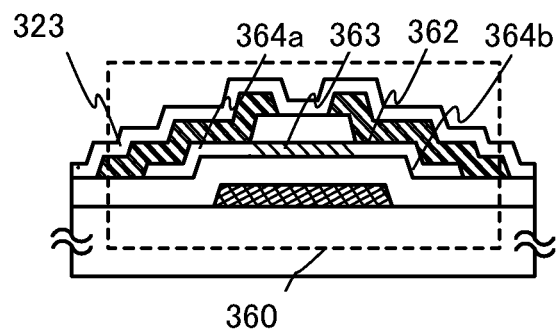

Thus, by the second heat treatment, the oxide semiconductor layer 332 becomes an oxide semiconductor layer 362 including regions with different resistances (indicated as a shaded region and a white region in FIG. 12B).

Then, a conductive film is formed over the gate insulating layer 322, the oxide semiconductor layer 362, and the oxide insulating layer 366. After that, a resist mask is formed in the fourth photolithography process, and a first electrode 365a and a second electrode 365b are formed by selective etching. Then, the resist mask is removed (see FIG. 12C).

Examples of the material for the first electrode 365a and the second electrode 365 include an element selected from Al, Cr, Cu, Ta, Ti, Mo, and W; an alloy containing any of these elements as its component; and an alloy film containing any of these elements in combination. Further, the metal conductive film can be a single layer or a stack of two or more layers.

In the above steps, the deposited oxide semiconductor layer is dehydrated or dehydrogenated by heat treatment, so that the resistance thereof is reduced; subsequently, part of the oxide semiconductor layer is selectively made to have excessive oxygen. As a result, the channel formation region 363 overlapping with the gate electrode 361 has high resistance and becomes intrinsic or substantially intrinsic. In addition, a low-resistance region 364a overlapping with the first electrode 365a and a low-resistance region 364b overlapping with the second electrode 365b are formed in a self-aligned manner. The above steps allow the transistor 360 to be formed.

Additional heat treatment can be performed at 100 to 200° C. in air for 1 to 30 hours. In this embodiment, the heat treatment is performed at 150° C. for 10 hours. This heat treatment can be performed at a fixed heating temperature or follow temperature cycles where the temperature repeatedly rises from room temperature to a heating temperature of 100 to 200° C. and drops from the a heating temperature to room temperature. Further, this heat treatment can be performed under reduced pressure before the oxide insulating layer is formed. Heat treatment under reduced pressure shortens the heating time.

By forming the low-resistance region 364b (or the low-resistance region 364a) in part of the oxide semiconductor layer which overlaps with the second electrode 365b (or the first electrode 365a), the reliability of the transistor can be improved. Specifically, by forming the low-resistance region 364b, the conductivity can be varied among the second electrode 365b, the low-resistance region 364b, and the channel formation region 363 (listed in descending order of their conductivities). Therefore, in the case where the transistor operates with the second electrode 365b connected to wiring for supplying high voltage supply potential VDD, the low-resistance region serves as a buffer and a high electric field is not applied locally even if a high electric field is applied between the gate electrode 361 and the second electrode 365b; thus, the breakdown voltage of the transistor can be improved.

Then, a protective insulating layer 323 is formed over the first electrode 365a, the second electrode 365b, and the oxide insulating layer 366. In this embodiment, the protective insulating layer 323 is formed using a silicon nitride film (see FIG. 12D).

By using the transistor including an oxide semiconductor layer described in this embodiment, a flip-flop can be made without being provided with a latch circuit. This results in a reduction in the number of transistors in the flip-flop and in power consumption. Further, reducing the number of transistors leads to a reduction in the area in an integrated circuit occupied by flip-flops.

(Embodiment 10)

In this embodiment, another example of the structure and manufacturing method of each of the transistors according to Embodiments 1 to 5 (the first to sixth transistors 100, 101, 104, 105, 106, and 107) is described. In other words, another example of the structure and manufacturing method of a transistor using a high-purity oxide semiconductor is described with reference to FIGS. 13A to 13D.

Figure 13A:
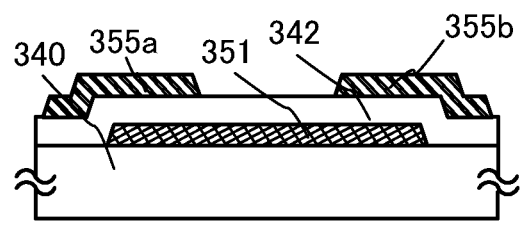
FIGS. 13A to 13D are cross-sectional views showing an example of the method of fabricating a transistor.
Figure 13B:
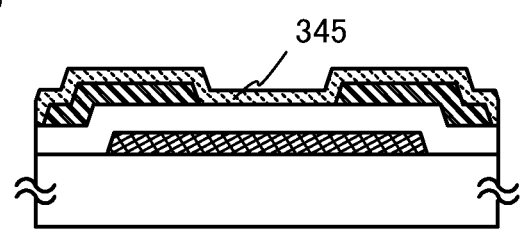
Figure 13C:
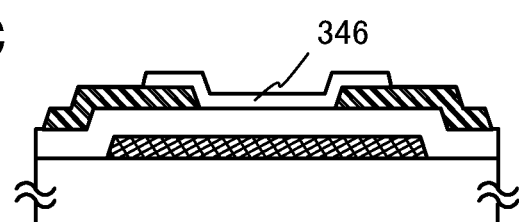
Figure 13D:
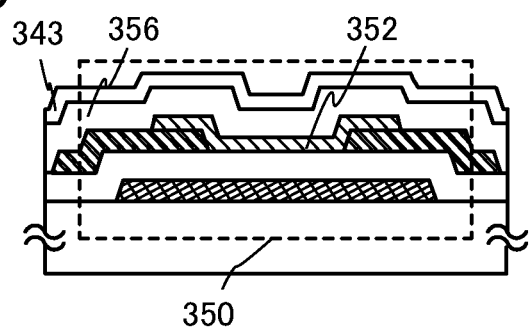

Note that although the transistor 350 in FIG. 13D is a single-gate transistor, the present invention is not limited to this configuration. The transistor can be a multi-gate transistor including a plurality of gate electrodes and a plurality of channel formation regions.

The process of fabricating a transistor 350 over a substrate 340 will be described below with reference to FIGS. 13A to 13D.

First, a conductive film is formed over the substrate 340, and then, a gate electrode 351 is formed in the first photolithography process. In this embodiment, a 150-nm-thick tungsten film is formed as the gate electrode 351 by sputtering.

Then, a gate insulating layer 342 is formed over the gate electrode 351. In this embodiment, a silicon oxynitride film having a thickness of 100 nm or less is formed by plasma CVD as the gate insulating layer 342.

Then, a conductive film is formed over the gate insulating layer 342. In the second photolithography process, a resist mask is formed over the conductive film, and selective etching is performed, thereby forming a first electrode 355a and a second electrode 355b. Then, the resist mask is removed (see FIG. 13A).

Then, an oxide semiconductor layer 345 is formed (see FIG. 13B). In this embodiment, the oxide semiconductor layer 345 is formed by sputtering using an In—Ga—Zn—O-based metal oxide target. Then, the oxide semiconductor layer 345 is processed into an island-shaped oxide semiconductor layer in the third photolithography process.

In the step of forming the oxide semiconductor layer 345, it is preferable that the oxide semiconductor layer 345 be formed while moisture remaining in the process chamber is removed so that the oxide semiconductor layer 345 may be prevented from containing hydrogen, hydroxyl, or moisture. The method for removing moisture remaining in the process chamber can be the same as that described in other embodiments.

Then, in order to dehydrate or dehydrogenate the oxide semiconductor layer, the first treatment is performed. The temperature of the first heat treatment is between 400 to 750° C., preferably 400° C. or higher and lower than the strain point of the substrate. Here, the substrate is put in an electric furnace which is a kind of heat treatment apparatus and heat treatment is performed on the oxide semiconductor layer in a nitrogen atmosphere at 450° C. for one hour. After that, the oxide semiconductor layer is prevented from being exposed to air and from containing water or hydrogen again. Thus, an oxide semiconductor layer 346 is obtained (see FIG. 13C).

The first heat treatment can employ GRTA, in which the substrate is transferred into an inert gas heated to a high temperature of 650 to 700° C., and heated for several minutes there, and then the substrate is transferred out of the inert gas heated to a high temperature.

Then, an oxide insulating layer 356 being in contact with the oxide semiconductor layer 346 is formed. The oxide insulating layer 356 has a thickness of 1 nm or more and can be formed by using as appropriate a method by which impurities such as water or hydrogen are not mixed into the oxide insulating layer 356 (e.g. sputtering). When hydrogen is contained in the oxide insulating layer 356, hydrogen may enter the oxide semiconductor layer or the extraction of oxygen in the oxide semiconductor layer caused by hydrogen may occur, and the resistance of a backchannel of the oxide semiconductor layer (which causes the transistor to be an n-type transistor) may be reduced, which may cause a parasitic channel to be formed. Therefore, it is important to form the oxide insulating layer 356 by a method by which hydrogen contained in the oxide insulating layer 356 is reduced as much as possible.

Note that the material and the formation method for the oxide insulating layer 356 can be similar to those for the oxide insulating layer 396 described in Embodiment 8.

Then, the second heat treatment (preferably at 200 to 400° C., e.g. 250 to 350° C.) is performed in an inert gas atmosphere or in an oxygen gas atmosphere. For example, the second heat treatment is performed in a nitrogen atmosphere at 250° C. for one hour. In the second heat treatment, a portion of the oxide semiconductor layer (a channel formation region) is heated while being in contact with the oxide insulating layer 356.

In the above steps, the oxide semiconductor layer that has been dehydrated or dehydrogenated by the first heat treatment, and thus has reduced resistance, is made to contain oxygen in excess. As a result, an intrinsic or substantially intrinsic oxide semiconductor layer 352 is formed. The above steps allow the transistor 350 to be formed.

Additional heat treatment can be performed at 100 to 200° C. in air for 1 to 30 hours. In this embodiment, the heat treatment is performed at 150° C. for 10 hours. This heat treatment can be performed at a fixed heating temperature or follow temperature cycles where the temperature repeatedly rises from room temperature to a heating temperature of 100 to 200° C. and drops from the a heating temperature to room temperature. Further, this heat treatment can be performed under reduced pressure before the oxide insulating layer is formed. Heat treatment under reduced pressure shortens the heating time. This heat treatment causes a small amount of hydrogen remaining in the oxide semiconductor layer to be introduced to the oxide insulating layer; thus, a normally-off transistor can be obtained. Consequently, the reliability of the semiconductor device can be improved.

Note that an insulating layer may be additionally provided over the oxide insulating layer 356. In this embodiment, an insulating layer 343 is formed over the oxide insulating layer 356 (see FIG. 13D). The material and the formation method for the insulating layer 343 can be similar to those for the insulating layer 398 described in Embodiment 8.

Further, a planarization insulating layer can be provided over a top surface of the insulating layer 343 for planarization purpose.

By using the transistor including an oxide semiconductor layer described in this embodiment, a flip-flop can be made without being provided with a latch circuit. This results in a reduction in the number of transistors in the flip-flop and in power consumption. Further, reducing the number of transistors leads to a reduction in the area in an integrated circuit occupied by flip-flops.

(Embodiment 11)

In this embodiment, specific examples of an electronic appliance including a semiconductor device described in the above embodiments will be described.

Figure 14A:
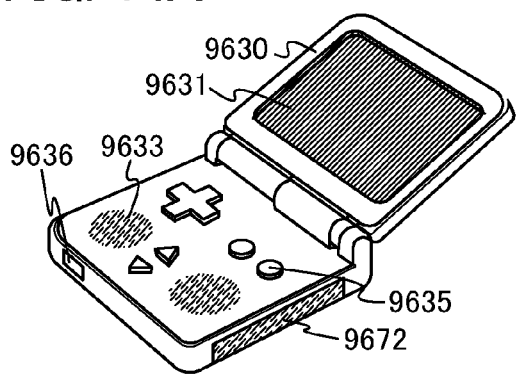
FIGS. 14A to 14C each shows an electronic appliance.

An electronic appliance illustrated in FIG. 14A is a portable game console which includes a housing 9630, a display portion 9631, a speaker 9633, operation keys 9635, a connection terminal 9636, a storage medium reading portion 9672, and the like. The portable game console can have a function of reading a program or data stored in a storage medium to display it on the display portion, and a function of sharing data with another portable game console by wireless communication. Note that the portable game console can have a variety of functions in addition to those given above.

Figure 14B:
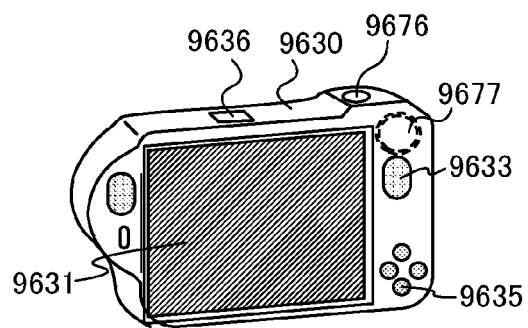

An electronic appliance illustrated in FIG. 14B is a digital camera which includes a housing 9630, a display portion 9631, a speaker 9633, operation keys 9635, a connection terminal 9636, a shutter button 9676, an image receiving portion 9677, and the like. The digital camera can have a function of photographing a still image and/or a moving image, a function of automatically or manually correcting the photographed image, a function of storing the photographed image data in a memory element, a function of displaying the photographed image data on the display portion, a television reception function, and the like. Note that the digital camera can have a variety of functions in addition to those given above.

Figure 14C:
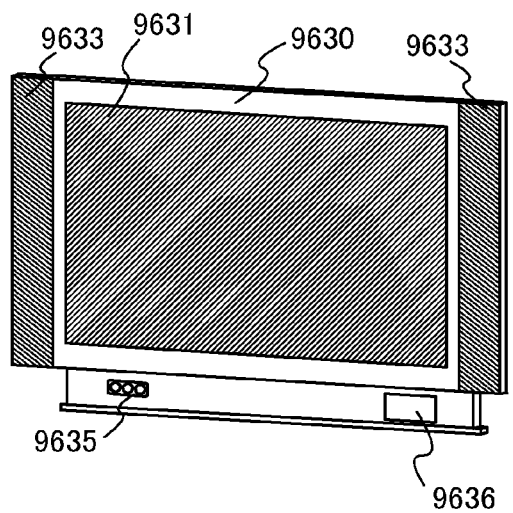

An electronic appliance illustrated in FIG. 14C is a television receiver which includes a housing 9630, a display portion 9631, speakers 9633, operation keys 9635, a connection terminal 9636, and the like. The television can have a function of converting a television electric wave into an image signal, a function of converting the image signal into a signal for display, a function of converting a frame frequency of the image signal, and the like. Note that the television receiver can have a variety of functions in addition to those given above.

Figure 15A:
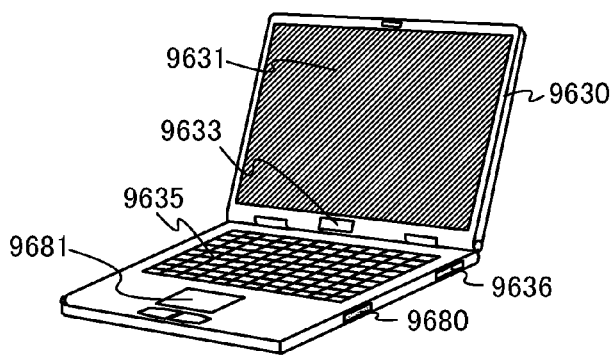
FIGS. 15A to 15D each shows an electronic appliance.

An electronic appliance illustrated in FIG. 15A is a computer which includes a housing 9630, a display portion 9631, a speaker 9633, operation keys 9635, a connection terminal 9636, a pointing device 9681, an external connection port 9680, and the like. The computer can have a function of displaying a variety of information (e.g., a still image, a moving image, and a text) on the display portion, a function of controlling processing with a variety of software (programs), a communication function such as wireless communication or wired communication, a function of being connected to various computer networks with the communication function, a function of transmitting or receiving a variety of data with the communication function, and the like. Note that the computer can have a variety of functions in addition to those given above.

Figure 15B:
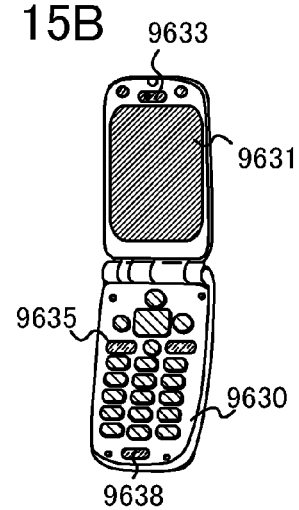

An electronic appliance illustrated in FIG. 15B is a cellular phone which includes a housing 9630, a display portion 9631, a speaker 9633, operation keys 9635, a microphone 9638, and the like. The cellular phone can have a function of displaying a variety of data (e.g., a still image, a moving image, and a text) on the display portion, a function of displaying a calendar, a date, the time, and the like on the display portion, a function for managing or editing the data displaying on the display portion, a function of controlling processing with various kinds of software (programs), and the like. Note that the cellular phone can have a variety of functions in addition to those given above.

Figure 15C:
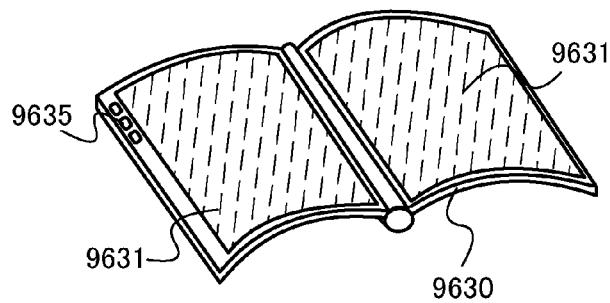

An electric device illustrated in FIG. 15C is an electronic paper including a housing 9630, a display portion 9631, operation keys 9635, and the like. The electronic paper can have a function of displaying a variety of data (e.g., a still image, a moving image, and a text) on the display portion, a function of displaying a calendar, a date, the time, and the like on the display portion, a function for managing or editing the data displaying on the display portion, a function of controlling processing with various kinds of software (programs), and the like. Note that the electronic paper can have a variety of functions in addition to those given above. An electronic paper can be specifically applied to an electronic book reader (also referred to as an e-book reader), a poster, and an advertisement in a vehicle such as a train, for example.

Figure 15D:
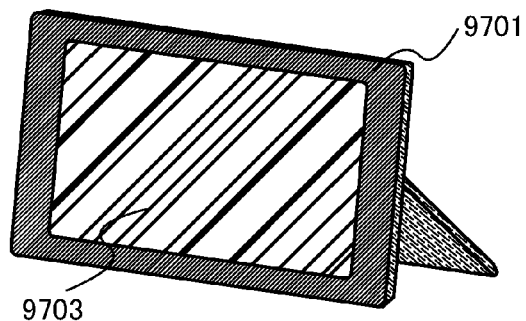

An electric device illustrated in FIG. 15D is a digital photo frame including a display portion 9703 incorporated in a housing 9701. The display portion 9703 can display a variety of images. For example, the display portion 9703 can display image data taken with a digital camera or the like and function like a normal photo frame.

Note that the digital photo frame is provided with an operation portion, an external connection terminal (e.g., a USB terminal and a terminal connectable to a variety of cables such as a USB cable), a storage medium insertion portion, and the like. Although these components may be provided on the same surface as the display portion, it is preferable to provide them on the side surface or the back surface for design aesthetics. For example, a storage medium storing image data taken with a digital camera is inserted into the storage medium insertion portion of the digital photo frame and the data is loaded, whereby the image can be displayed on the display portion 9703.

The digital photo frame can have a function of receiving and transmitting data by wireless communication. With such a function, the digital photo frame can obtain desired image data by wireless communication and display the data. Note that the digital photo frame can have a variety of functions in addition to those given above.

A flip-flop which is one embodiment of the present invention can be used as a part of an integrated circuit in a display portion of any of the above-described electronic appliances. Note that a flip-flop which is one embodiment of the present invention can be provided to various electronic appliances in addition to electronic appliances including a display portion (display devices). Thus, electronic appliances to which the present invention is applicable are not only the above-described specific examples of an electronic appliance. For example, the present invention is applicable to semiconductor devices capable of wirelessly transmitting and receiving data (data carries called RF tags, ID tags, IC tags, IC chips, wireless tags, or electronic tags).

By applying a semiconductor device which is one embodiment of the present invention to those electronic appliances, the power consumption of those electronic appliances can be reduced.

This application is based on Japanese Patent Application serial no. 2009-291587 filed with the Japan Patent Office on Dec. 23, 2009, the entire contents of which are hereby incorporated by reference.

EXPLANATION OF REFERENCES

100: transistor, 101: transistor, 102: inverter, 103: inverter, 104: transistor, 105: transistor, 106: transistor, 107: transistor, 111: capacitor, 112: capacitor, 120: inverter, 320: substrate, 322: gate insulating layer, 323: protective insulating layer, 332: island-shaped oxide semiconductor layer, 340: substrate, 342: gate insulating layer, 343: insulating layer, 345: oxide semiconductor layer, 346: oxide semiconductor layer, 350: transistor, 351: gate electrode, 352: intrinsic or substantially intrinsic oxide semiconductor layer, 355*a*: first electrode, 355*b*: second electrode, 356: oxide insulating layer, 360: transistor, 361: gate electrode, 362: oxide semiconductor layer, 363: channel formation region, 364*a*: low-resistance region, 364*b*: low-resistance region, 365*a*: first electrode, 365*b*: second electrode, 366: oxide insulating layer, 390: transistor, 391: gate electrode, 392: oxide semiconductor layer, 393: oxide semiconductor layer, 394: substrate, 395*a*: first electrode, 395*b*: second electrode, 396: protective insulating layer, 397: gate insulating layer, 398: protective insulating layer, 400: substrate, 402: gate insulating layer, 407: insulating layer, 410: transistor, 411: gate electrode, 412: island-shaped oxide semiconductor layer, 414*a*: first wiring, 414*b*: second wiring, 415*a*: first electrode, 415*b*: second electrode, 421*a*: opening, 421*b*: opening, 1998: time, 1999: time, 2000: time, 2001: time, 2002: time, 2003: time, 9630: housing, 9631: display portion, 9633: speaker, 9635: operation keys, 9636: connection terminal, 9638: microphone, 9672: storage medium reading portion, 9676: shutter button, 9677: image receiving portion, 9680: external connection port, 9701: housing, 9703: display portion, 9681: pointing device.

The invention claimed is:

1. A semiconductor device comprising:
    a first transistor;
    a second transistor;
    a first inverter circuit comprising first inverter transistors; and
    a second inverter circuit comprising second inverter transistors,
    wherein one of a source and a drain of the first transistor is electrically connected to a first wiring;
    wherein the other of the source and the drain of the first transistor is electrically connected to an input of the first inverter circuit;
    wherein an output of the first inverter circuit is electrically connected to one of a source and a drain of the second transistor;
    wherein the other of the source and the drain of the second transistor is electrically connected to an input of the second inverter circuit;
    wherein an output of the second inverter circuit is electrically connected to a second wiring;
    wherein each of the first transistor and the second transistor comprises a channel formation region in an oxide semiconductor layer; and
    wherein at least one of the first inverter transistors and one of the second inverter transistors comprise a channel formation region in a material other than an oxide semiconductor material.

2. A semiconductor device comprising:
    a first transistor;
    a second transistor;
    a third transistor;
    a fourth transistor;
    a first inverter circuit comprising first inverter transistors; and
    a second inverter circuit comprising second inverter transistors,
    wherein the semiconductor device is configured to input a reset signal to a gate of the third transistor and a gate of the fourth transistor;
    wherein one of a source and a drain of the first transistor is electrically connected to a first wiring;
    wherein the other of the source and the drain of the first transistor is electrically connected to an input of the first inverter circuit;

wherein an output of the first inverter circuit is electrically connected to one of a source and a drain of the second transistor;

wherein the other of the source and the drain of the second transistor is electrically connected to an input of the second inverter circuit;

wherein an output of the second inverter circuit is electrically connected to a second wiring;

wherein one of a source and a drain of the third transistor is electrically connected to the input of the first inverter circuit;

wherein the other of the source and the drain of the third transistor is electrically connected to a low voltage supply line;

wherein one of a source and a drain of the fourth transistor is electrically connected to the input of the second inverter circuit;

wherein the other of the source and the drain of the fourth transistor is electrically connected to a high voltage supply line;

wherein each of the first transistor and the second transistor comprises a channel formation region in an oxide semiconductor layer; and wherein at least one of the first inverter transistors and one of the second inverter transistors comprise a channel formation region in a material other than an oxide semiconductor material.

3. A semiconductor device comprising:
a first transistor;
a second transistor;
a fifth transistor;
a sixth transistor;
a first inverter circuit comprising first inverter transistors; and
a second inverter circuit comprising second inverter transistors, wherein the semiconductor device is configured to input a set signal to a gate of the fifth transistor and a gate of the sixth transistor;

wherein one of a source and a drain of the first transistor is electrically connected to a first wiring;

wherein the other of the source and the drain of the first transistor is electrically connected to an input of the first inverter circuit;

wherein an output of the first inverter circuit is electrically connected to one of a source and a drain of the second transistor;

wherein the other of the source and the drain of the second transistor is electrically connected to an input of the second inverter circuit;

wherein an output of the second inverter circuit is electrically connected to a second wiring;

wherein one of a source and a drain of the fifth transistor is electrically connected to the input of the first inverter circuit;

wherein the other of the source and the drain of the fifth transistor is electrically connected to a high voltage supply line;

wherein one of a source and a drain of the sixth transistor is electrically connected to the input of the second inverter circuit;

wherein the other of the source and the drain of the sixth transistor is electrically connected to a low voltage supply line;

wherein each of the first transistor and the second transistor comprises a channel formation region in an oxide semiconductor layer; and wherein at least one of the first inverter transistors and one of the second inverter transistors comprise a channel formation region in a material other than an oxide semiconductor material.

4. A semiconductor device comprising:
a first transistor;
a second transistor;
a third transistor;
a fourth transistor;
a fifth transistor;
a sixth transistor;
a first inverter circuit comprising first inverter transistors; and
a second inverter circuit comprising second inverter transistors, wherein the semiconductor device is configured to input a reset signal to a gate of the third transistor and a gate of the fourth transistor;

wherein the semiconductor device is configured to input a set signal to a gate of the fifth transistor and a gate of the sixth transistor;

wherein one of a source and a drain of the first transistor is electrically connected to a first wiring;

wherein the other of the source and the drain of the first transistor is electrically connected to an input of the first inverter circuit;

wherein an output of the first inverter circuit is electrically connected to one of a source and a drain of the second transistor;

wherein the other of the source and the drain of the second transistor is electrically connected to an input of the second inverter circuit;

wherein an output of the second inverter circuit is electrically connected to a second wiring;

wherein one of a source and a drain of the third transistor is electrically connected to the input of the first inverter circuit;

wherein the other of the source and the drain of the third transistor is electrically connected to a low voltage supply line;

wherein one of a source and a drain of the fourth transistor is electrically connected to the input of the second inverter circuit;

wherein the other of the source and the drain of the fourth transistor is electrically connected to a high voltage supply line;

wherein one of a source and a drain of the fifth transistor is electrically connected to the input of the first inverter circuit;

wherein the other of the source and the drain of the fifth transistor is electrically connected to the high voltage supply line;

wherein one of a source and a drain of the sixth transistor is electrically connected to the input of the second inverter circuit;

wherein the other of the source and the drain of the sixth transistor is electrically connected to the low voltage supply line;

wherein each of the first transistor and the second transistor comprises a channel formation region in an oxide semiconductor layer; and wherein at least one of the first inverter transistors and one of the second inverter transistors comprise a channel formation region in a material other than an oxide semiconductor material.

5. A semiconductor device comprising:
a first transistor;
a second transistor;
a first inverter circuit comprising first inverter transistors;
a second inverter circuit comprising second inverter transistors,
a first capacitor comprising a first pair of electrodes; and
a second capacitor comprising a second pair of electrodes,
wherein one of a source and a drain of the first transistor is electrically connected to a first wiring;
wherein the other of the source and the drain of the first transistor is electrically connected to an input of the first inverter circuit;
wherein an output of the first inverter circuit is electrically connected to one of a source and a drain of the second transistor;
wherein the other of the source and the drain of the second transistor is electrically connected to an input of the second inverter circuit;
wherein an output of the second inverter circuit is electrically connected to a second wiring;
wherein one electrode of the first capacitor is electrically connected to the input of the first inverter circuit;
wherein the other electrode of the first capacitor is electrically connected to a low voltage supply line;
wherein one electrode of the second capacitor is electrically connected to the input of the second inverter circuit;
wherein the other electrode of the second capacitor is electrically connected to the low voltage supply line;
wherein each of the first transistor and the second transistor comprises a channel formation region in an oxide semiconductor layer; and
wherein at least one of the first inverter transistors and one of the second inverter transistors comprise a channel formation region in a material other than an oxide semiconductor material.

6. The semiconductor device according to claim 1, the semiconductor device being further configured to input an inverted clock signal to a gate of the first transistor and a clock signal to a gate of the second transistor.

7. The semiconductor device according to claim 2, the semiconductor device being further configured to input an inverted clock signal to a gate of the first transistor and a clock signal to a gate of the second transistor.

8. The semiconductor device according to claim 3, the semiconductor device being further configured to input an inverted clock signal to a gate of the first transistor and a clock signal to a gate of the second transistor.

9. The semiconductor device according to claim 4, the semiconductor device being further configured to input an inverted clock signal to a gate of the first transistor and a clock signal to a gate of the second transistor.

10. The semiconductor device according to claim 5, the semiconductor device being further configured to input an inverted clock signal to a gate of the first transistor and a clock signal to a gate of the second transistor.

11. The semiconductor device according to claim 2, further comprising:
a first capacitor comprising a first pair of electrodes; and
a second capacitor comprising a second pair of electrodes,
wherein one electrode of the first capacitor is electrically connected to the input of the first inverter circuit;
wherein the other electrode of the first capacitor is electrically connected to the low voltage supply line;
wherein one electrode of the second capacitor is electrically connected to the input of the second inverter circuit; and
wherein the other electrode of the second capacitor is electrically connected to the low voltage supply line.

12. The semiconductor device according to claim 3, further comprising:
a first capacitor comprising a first pair of electrodes; and
a second capacitor comprising a second pair of electrodes,
wherein one electrode of the first capacitor is electrically connected to the input of the first inverter circuit;
wherein the other electrode of the first capacitor is electrically connected to the low voltage supply line;
wherein one electrode of the second capacitor is electrically connected to the input of the second inverter circuit; and
wherein the other electrode of the second capacitor is electrically connected to the low voltage supply line.

13. The semiconductor device according to claim 4, further comprising:
a first capacitor comprising a first pair of electrodes; and
a second capacitor comprising a second pair of electrodes,
wherein one electrode of the first capacitor is electrically connected to the input of the first inverter circuit;
wherein the other electrode of the first capacitor is electrically connected to the low voltage supply line;
wherein one electrode of the second capacitor is electrically connected to the input of the second inverter circuit; and
wherein the other electrode of the second capacitor is electrically connected to the low voltage supply line.

14. The semiconductor device according to claim 1, wherein any of the first transistor and the second transistor includes an oxide semiconductor layer in which a carrier concentration is less than $1 \times 10^{14}/cm^3$.

15. The semiconductor device according to claim 2, wherein any of the first transistor, the second transistor, the third transistor and the fourth transistor includes an oxide semiconductor layer in which a carrier concentration is less than $1 \times 10^{14}/cm^3$.

16. The semiconductor device according to claim 3, wherein any of the first transistor, the second transistor, the fifth transistor and the sixth transistor includes an oxide semiconductor layer in which a carrier concentration is less than $1 \times 10^{14}/cm^3$.

17. The semiconductor device according to claim 4, wherein any of the first transistor, the second transistor, the third transistor, the fourth transistor, the fifth transistor and the sixth transistor includes an oxide semiconductor layer in which a carrier concentration is less than $1 \times 10^{14}/cm^3$.

18. The semiconductor device according to claim 5, wherein any of the first transistor and the second transistor includes an oxide semiconductor layer in which a carrier concentration is less than $1 \times 10^{14}/cm^3$.

19. The semiconductor device according to claim 14, wherein a band gap of the oxide semiconductor layer is 2 eV or more.

20. The semiconductor device according to claim 15, wherein a band gap of the oxide semiconductor layer is 2 eV or more.

21. The semiconductor device according to claim 16, wherein a band gap of the oxide semiconductor layer is 2 eV or more.

22. The semiconductor device according to claim 17, wherein a band gap of the oxide semiconductor layer is 2 eV or more.

23. The semiconductor device according to claim 18, wherein a band gap of the oxide semiconductor layer is 2 eV or more.

24. The semiconductor device according to claim 1,
wherein the first inverter circuit and the second inverter circuit each are a CMOS inverter circuit comprising at least a p-channel transistor with a channel formation region formed in silicon.

25. The semiconductor device according to claim 2,
wherein the first inverter circuit and the second inverter circuit each are a CMOS inverter circuit comprising at least a p-channel transistor with a channel formation region formed in silicon.

26. The semiconductor device according to claim 3,
wherein the first inverter circuit and the second inverter circuit each are a CMOS inverter circuit comprising at least a p-channel transistor with a channel formation region formed in silicon.

27. The semiconductor device according to claim 4,
wherein the first inverter circuit and the second inverter circuit each are a CMOS inverter circuit comprising at least a p-channel transistor with a channel formation region formed in silicon.

28. The semiconductor device according to claim 5,
wherein the first inverter circuit and the second inverter circuit each are a CMOS inverter circuit comprising at least a p-channel transistor with a channel formation region formed in silicon.

29. The semiconductor device according to claim 1, wherein the semiconductor device is a flip-flop.

30. The semiconductor device according to claim 2, wherein the semiconductor device is a flip-flop.

31. The semiconductor device according to claim 3, wherein the semiconductor device is a flip-flop.

32. The semiconductor device according to claim 4, wherein the semiconductor device is a flip-flop.

33. The semiconductor device according to claim 5, wherein the semiconductor device is a flip-flop.

34. An electronic appliance including the semiconductor device according to claim 1.

35. An electronic appliance including the semiconductor device according to claim 2.

36. An electronic appliance including the semiconductor device according to claim 3.

37. An electronic appliance including the semiconductor device according to claim 4.

38. An electronic appliance including the semiconductor device according to claim 5.

* * * * *